(12) United States Patent
Hayashi et al.

(10) Patent No.: US 12,324,105 B2
(45) Date of Patent: Jun. 3, 2025

(54) MALEIMIDE RESIN COMPOSITION, PREPREG, RESIN FILM, LAMINATED BOARD, PRINTED WIRING BOARD, AND SEMICONDUCTOR PACKAGE

(71) Applicant: Resonac Corporation, Tokyo (JP)

(72) Inventors: Chihiro Hayashi, Tokyo (JP); Minoru Kakitani, Tokyo (JP); Takao Tanigawa, Tokyo (JP); Ryuji Akebi, Tokyo (JP); Naoyoshi Sato, Tokyo (JP); Akira Horie, Tokyo (JP)

(73) Assignee: Resonac Corporation, Tokyo (JP)

( * ) Notice: Subject to any disclaimer, the term of this patent is extended or adjusted under 35 U.S.C. 154(b) by 227 days.

(21) Appl. No.: 18/036,798

(22) PCT Filed: Nov. 16, 2021

(86) PCT No.: PCT/JP2021/041979
§ 371 (c)(1),
(2) Date: May 12, 2023

(87) PCT Pub. No.: WO2022/102780
PCT Pub. Date: May 19, 2022

(65) Prior Publication Data
US 2024/0032209 A1 Jan. 25, 2024

(30) Foreign Application Priority Data
Nov. 16, 2020 (JP) ................. 2020-190381

(51) Int. Cl.
| | | |
|---|---|---|
| *H05K 1/02* | (2006.01) | |
| *C07D 207/448* | (2006.01) | |
| *C07D 207/452* | (2006.01) | |
| *C08K 5/00* | (2006.01) | |
| *C08K 5/08* | (2006.01) | |
| *C08K 5/16* | (2006.01) | |
| *C08K 5/20* | (2006.01) | |
| *C08K 5/3415* | (2006.01) | |
| *C08L 25/12* | (2006.01) | |
| *C08L 25/16* | (2006.01) | |
| *C08L 27/06* | (2006.01) | |
| *C08L 33/18* | (2006.01) | |
| *C08L 35/00* | (2006.01) | |
| *C08L 39/04* | (2006.01) | |
| *C08L 51/04* | (2006.01) | |
| *C08L 51/08* | (2006.01) | |
| *C08L 69/00* | (2006.01) | |
| *H01L 23/498* | (2006.01) | |
| *H05K 1/03* | (2006.01) | |
| *H05K 3/12* | (2006.01) | |
| *H05K 3/46* | (2006.01) | |

(52) U.S. Cl.
CPC ............ *H05K 3/4652* (2013.01); *C08L 39/04* (2013.01); *H01L 23/49822* (2013.01); *H05K 1/0353* (2013.01); *H05K 3/1283* (2013.01); *C08L 2203/20* (2013.01); *H05K 2201/10007* (2013.01); *H05K 2203/068* (2013.01)

(58) Field of Classification Search
CPC ...... H05K 1/02; H05K 1/0353; H05K 3/1283; H05K 3/4652; H05K 2201/10007; H05K 2203/068; C07D 207/448; C07D 207/452; C08K 5/00; C08K 5/0008; C08K 5/0041; C08K 5/0091; C08K 5/16; C08K 5/20; C08K 5/3415; C08L 25/12; C08L 25/16; C08L 27/06; C08L 33/18; C08L 39/04; C08L 51/04; C08L 51/08; C08L 69/00; C08L 69/005; C08L 2203/20
USPC ..... 174/255; 428/212, 354, 411.1, 500, 515; 524/104, 105, 106, 109, 111, 191, 192, 524/193, 228, 229, 548, 549; 525/63, 70, 525/72, 73, 74, 76, 77, 84, 85, 92 E, 146, 525/148, 229, 279, 284, 308, 309, 311, 525/942; 526/262, 342, 347
See application file for complete search history.

(56) References Cited

U.S. PATENT DOCUMENTS

| | | | | |
|---|---|---|---|---|
| 3,886,231 | A * | 5/1975 | Nield | ............ C08L 33/18 525/76 |
| 4,229,550 | A | 10/1980 | Jones et al. | |
| 4,929,673 | A * | 5/1990 | Laughner | ............ C08L 25/12 525/146 |
| 5,143,953 | A * | 9/1992 | Pourahmady | ...... C07D 207/452 524/109 |

(Continued)

FOREIGN PATENT DOCUMENTS

| | | |
|---|---|---|
| JP | 55-127419 A | 10/1980 |
| JP | 06-192478 A | 7/1994 |

(Continued)

*Primary Examiner* — Xiaoliang Chen
(74) *Attorney, Agent, or Firm* — FITCH, EVEN, TABIN & FLANNERY, LLP

(57) ABSTRACT

Provided are a maleimide resin composition containing (A) one or more selected from the group consisting of a maleimide compound having two or more N-substituted maleimide groups and a derivative thereof, (B) a modified conjugated diene polymer, and (C) a thermoplastic elastomer other than the above component (B), wherein the component (B) is one resulting from modification of (b1) a conjugated diene polymer having a vinyl group in the side chain with (b2) a maleimide compound having two or more N-substituted maleimide groups; and a prepreg, a resin film, a laminated board, a printed wiring board and a semiconductor package, each using the maleimide resin composition.

15 Claims, No Drawings

(56) References Cited

U.S. PATENT DOCUMENTS

| | | | | |
|---|---|---|---|---|
| 5,155,151 A | * | 10/1992 | Hashimoto | C08K 5/0041 |
| | | | | 524/192 |
| 5,714,541 A | * | 2/1998 | Piejko | C08F 279/04 |
| | | | | 525/73 |
| 5,726,265 A | * | 3/1998 | Piejko | C08L 51/04 |
| | | | | 526/342 |
| 6,150,035 A | * | 11/2000 | DeFife | B32B 7/06 |
| | | | | 428/354 |

FOREIGN PATENT DOCUMENTS

| | | |
|---|---|---|
| JP | 2008-133454 A | 6/2008 |
| JP | 2008-291227 A | 12/2008 |
| JP | 2018-012747 A | 1/2018 |
| WO | 2020/262537 A1 | 12/2020 |

* cited by examiner

MALEIMIDE RESIN COMPOSITION, PREPREG, RESIN FILM, LAMINATED BOARD, PRINTED WIRING BOARD, AND SEMICONDUCTOR PACKAGE

CROSS-REFERENCE TO RELATED APPLICATIONS

This application is a U.S. national phase application filed under 35 U.S.C. § 371 of International Application No. PCT/JP2021/041979, filed Nov. 16, 2021, designating the United States, which claims priority from Japanese Application No. 2020-190381, filed Nov. 16, 2020, which are incorporated herein by reference in their entireties.

TECHNICAL FIELD

The present invention relates to a maleimide resin composition, a prepreg, a resin film, a laminated board, a printed wiring board, and a semiconductor package.

BACKGROUND ART

Signals used in mobile communication devices represented by a cell phone, base station apparatuses for them, network infrastructure devices, such as a server and a router, large-sized computers, and the like are being increased in the speed and capacity every year. In accordance with this situation, printed wiring boards to be mounted on these electronic devices are required to adapt to high-frequency signals, and a substrate material having excellent dielectric characteristics in a high-frequency band which enables reduction of a transmission loss is demanded. Dielectric characteristics mean a low dielectric constant and a low dielectric dissipation factor, and dielectric characteristics in a high-frequency band may be referred to as high-frequency characteristics.

In recent years, as such applications that handle such high-frequency signals, not only in the above-mentioned electronic devices but also in the ITS field such as automobiles and traffic systems related art as well as in the field of indoor short-distance communications, practical use or practical realization planning for novel systems that handle high-frequency radio signals are being promoted. In the future, low transmission-loss substrate materials are expected to be required for the printed wiring boards to be mounted on such devices.

Printed wiring boards are first required to have heat resistance and low thermal expansion capable of withstanding use environments. Consequently, resins excellent in mechanical characteristics such as maleimide compounds are employed, but these resins have a polar group and therefore improvement of high-frequency characteristics thereof is required.

Given the situation, for a printed wiring board required to have a low transmission loss, a thermoplastic polymer excellent in high-frequency characteristics has been used. As the thermoplastic polymer, for example, polyphenylene ether, polybutadiene and the like are effective for lowering the dielectric dissipation factor. However, such thermoplastic polymers have problems in that the heat resistance is low, the thermal expansion coefficient is high as compared with metals, the and mechanical characteristics are poor.

For providing a substrate material excellent in mechanical characteristics and capable of reducing transmission loss, it is desired to use a resin composition having both these characteristics. However, thermoplastic polymers have poor compatibility with other resins, and therefore there may occur separation between a thermoplastic polymer and the other component in a resin composition, and as a result, when a thermoplastic polymer is used, a resin composition excellent in handleability is difficult to obtain.

Given the situation, as a method for improving the compatibility of a thermoplastic polymer, a method for modifying the thermoplastic polymer is investigated.

An object of PTL 1 is to provide a thermosetting resin composition which has low dielectric dissipation factor and low thermal expansion and is excellent in wiring embedding and flatness. PTL 1 discloses a technique regarding a thermosetting resin composition including an inorganic filler (A) and a polyimide compound (B) having a structural unit derived from a maleimide compound (a1) having at least two N-substituted maleimide groups and a structural unit derived from a diamine compound (a2), in which an acid anhydride-modified polybutadiene-based elastomer is blended.

CITATION LIST

Patent Literature

PTL 1: JP 2018-012747 A

SUMMARY OF INVENTION

Technical Problem

The resin composition described in PTL 1 brings about such results that the dielectric characteristics are excellent also in a high-frequency band by improving the compatibility of the thermoplastic polymer. However, in recent years, substrate materials are required to be applicable for a fifth generation mobile communication system (generally called 5G) antenna that uses radio waves in the frequency band of over 6 GHz and a millimeter wave radar that uses radio waves in the frequency band of 30 to 300 GHz. To do so, the development of a resin composition in which the dielectric characteristics in a band of 10 GHz or higher are much more improved is needed. However, according to the technique of PTL 1, it was difficult to achieve a further improvement in dielectric characteristics while keeping various properties favorable.

In view of the foregoing present circumstances, an object of the present invention is to provide a maleimide resin composition which, though containing a thermoplastic polymer, is excellent in handleability, has good heat resistance and low thermal expansion and can exhibit excellent dielectric characteristics in a high-frequency band of 10 GHz or higher, and to provide a prepreg, a resin film, a laminated board, a printed wiring board and a semiconductor package, each using the foregoing maleimide resin composition.

Solution to Problem

The present inventors made extensive and intensive investigations and, as a result, have found that the above-mentioned problems can be solved by the following present embodiment.

One mode of the present embodiment includes the following [1] to [15].
  [1] A maleimide resin composition containing:
    (A) one or more selected from the group consisting of a maleimide compound having one or more N-substituted maleimide groups and a derivative thereof;

(B) a modified conjugated diene polymer, and
(C) a thermoplastic elastomer other than the above component (B),
in which:
the component (B) is one resulting from modification of (b1) a conjugated diene polymer having a vinyl group in the side chain with (b2) a maleimide compound having two or more N-substituted maleimide groups.
[2] The maleimide resin composition according to the above [1], in which the component (B) has, in the side chain, a substituent (x) resulting from reaction between the vinyl group which the component (b1) has and the N-substituted maleimide group which the component (b2) has.
[3] The maleimide resin composition according to the above [2], in which the substituent (x) is a group containing, as a structure derived from the component (b2), a structure represented by the following general formula (B-11) or (B-12):

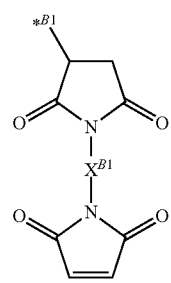

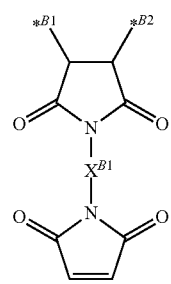

wherein $X^{B1}$ is a divalent organic group; $*^{B1}$ is a site binding with the carbon atom derived from the vinyl group which the component (b1) has in the side chain; and $*^{B2}$ is a site binding with other atom.
[4] The maleimide resin composition according to any of the above [1] to [3], in which the number average molecular weight of the component (B) is 700 to 6,000.
[5] The maleimide resin composition according to any of the above [1] to [4], in which the component (b1) is a polybutadiene having a 1,2-vinyl group.
[6] The maleimide resin composition according to the above [5], in which the content of a structural unit having a 1,2-vinyl group is 50 mol % or more relative to the total structural units derived from butadiene constituting the polybutadiene having a 1,2-vinyl group.
[7] The maleimide resin composition according to any of the above [1] to [6], in which the component (b2) is at least one selected from the group consisting of an aromatic maleimide compound having one N-substituted maleimide group in the molecule, an aromatic bismaleimide compound having two N-substituted maleimide groups in the molecule and an aromatic polymaleimide compound having three or more N-substituted maleimide groups in the molecule.
[8] The maleimide resin composition according to any of the above [1] to [7], in which a content ratio of the component (A) to the component (B) [(A)/(B)] is more than 1.0 on a mass basis.
[9] The maleimide resin composition according to any of the above [1] to [8], in which, relative to 100 parts by mass of the total of the components (A) to (C), the content of the component (A) is 10 to 90 parts by mass, the content of the component (B) is 1 to 50 parts by mass, and the content of the component (C) is 5 to 60 parts by mass.
[10] A prepreg containing the maleimide resin composition according any of the above [1] to [9] or a semi-cured product of the maleimide resin composition.
[11] A resin film containing the maleimide resin composition according any of the above [1] to [9] or a semi-cured product of the maleimide resin composition.
[12] A laminated board having a cured product of the maleimide resin composition of any of the above [1] to [9] or a cured product of the prepreg of the above [10], and a metal foil.
[13] A printed wiring board having one or more selected from the group consisting of a cured product of the maleimide resin composition of any of the above [1] to [9], a cured product of the prepreg of the above [10], and the laminated board of the above [12].
[14] A semiconductor package having the printed wiring board of the above and a semiconductor device.
[15] A method for producing the maleimide resin composition of any of the above [1] to [9], the method including the following steps 1 and 2:
Step 1: a step of reacting (b1) a conjugated diene polymer having a vinyl group in the side chain and (b2) a maleimide compound having two or more N-substituted maleimide groups to obtain (B) a modified conjugated diene polymer; and
Step 2: a step of mixing (A) one or more selected from the group consisting of a maleimide compound having one or more N-substituted maleimide groups and a derivative thereof, (B) the modified conjugated diene polymer and (C) a thermoplastic elastomer other than the component (B).

Advantageous Effects of Invention

In accordance with the present embodiment, it is possible to provide a maleimide resin composition developing excellent dielectric characteristics in a high-frequency band of 10 GHz or higher while having favorable heat resistance and low thermal expansion and having excellent handleability and also to provide a prepreg, a resin film, a laminated board, a printed wiring board and a semiconductor package, each using the foregoing maleimide resin composition.

DESCRIPTION OF EMBODIMENTS

In a numerical range described in this description, the upper limit or the lower limit of the numerical range may be substituted by values shown in Examples. In addition, the upper limit or the lower limit of a numerical range are respectively appropriately combined with the lower limit or the upper limit of another numerical range. The expression of a numerical range "AA to BB" includes the numerical values AA and BB at both ends as the lower limit and the upper limit respectively.

In this description, for example, a description "10 or more" means 10 and a numerical value more than 10, and the same shall apply to other cases of different numerical values. Also for example, a description "10 or less" means 10 and a numerical value less than 10, and the same shall apply to other cases of different numerical values.

Unless otherwise specified, components and materials exemplified in this description may be used alone or may be used in combination of two or more thereof. In this description, when plural substances corresponding to each component are present in a composition, the content of each component in the composition means a total amount of the plural substances present in the composition unless otherwise specified.

In this description, "resin component" is defined to include all the components except an inorganic compound such as an inorganic filler (D) to be mentioned below, among the solid content constituting the resin composition.

In this description, "solid content" is meant to include the components in the resin composition except water and a volatile substance such as an organic solvent. Specifically, the solid content can include those that are liquid, millet jelly-like or waxy at around 25° C., and does not always mean a solid.

An expression "containing . . . " or "including . . . " in this description may be generally expressed as "made by containing . . . " or "made by including . . . ", and the both are the same in this description. In other words, both these expressions mean both a case of merely containing . . . or including . . . , and a case of containing or including the components described on . . . in a reacted state.

An aspect in which any items described in this description are appropriately combined is encompassed in the present invention.

[Maleimide Resin Composition]

The maleimide resin composition of the present embodiment [hereinafter occasionally abbreviated simply as a "resin composition"] is a maleimide resin composition containing:

(A) one or more selected from the group consisting of a maleimide compound having one or more N-substituted maleimide groups and a derivative thereof [hereinafter this may be simply abbreviated as a maleimide compound (A) or a component (A)], (B) a modified conjugated diene polymer [hereinafter this may be referred to as a modified conjugated diene polymer (B) or abbreviated as a component (B)], and (C) a thermoplastic elastomer other than the above component (B) [hereinafter this may be abbreviated as other thermoplastic elastomer (C) or a component (C)], in which:

the component (B) is one resulting from modification of
(b1) a conjugated diene polymer having a vinyl group in the side chain [hereinafter this may be simply abbreviated as a dienic polymer (b1) or a component (b1)] with (b2) a maleimide compound having two or more N-substituted maleimide groups [hereinafter this may be simply abbreviated as a maleimide compound (b2) or a component (b2)].

Although the reason why the maleimide resin composition of the present embodiment develops excellent dielectric characteristics in a high-frequency band of 10 GHz or higher while having favorable heat resistance and low thermal expansion and having excellent handleability is not elucidated yet, the following may be conjectured.

In view of the fact that the conjugated diene polymer does not contain a group having polarity in the molecule, it is effective for lowering the dielectric dissipation factor. However, the conjugated diene polymer is inferior in compatibility with the maleimide compound, and therefore, it is inferior in handleability, such as occurrence of separation. On the other hand, when an oxygen atom or the like is introduced into the conjugated diene polymer in order to improve this, an effect for lowering the dielectric dissipation factor becomes small. In contrast, as for the maleimide resin composition of the present embodiment, as the conjugated diene polymer, one having a vinyl group in the side chain is adopted, and the vinyl group is allowed to react with the maleimide compound for modification in advance, whereby the compatibility of the conjugated diene polymer with the maleimide compound and the thermoplastic elastomer to be subsequently used as main agents is improved. According to this, the maleimide resin composition of the present embodiment is excellent in handleability.

Furthermore, the resin composition of the present embodiment is not only excellent in compatibility but also excellent in heat resistance and thermal expansion coefficient, and the dielectric dissipation factor is unexpectedly lowered. It may be conjectured that this is the result of the fact that (1) when the conjugated diene polymer is compatibilized with the maleimide compound, the effect for lowering the dielectric dissipation factor is sufficiently exhibited, (2) the compatibilized thermoplastic elastomer-derived mechanical characteristics can be sufficiently exhibited, and in addition to these, (3) the N-substituted maleimide group having been introduced into the conjugated diene polymer owing to the maleimide compound for modification reacts well with the maleimide compound (A) to be subsequently used as a main agent, whereby the curability of the entire resin composition is improved.

The constituent components are hereunder successively described in detail.

<Maleimide Compound (A)>

The maleimide compound (A) is one or more selected from the group consisting of a maleimide compound having one or more N-substituted maleimide groups and a derivative thereof.

Examples of the aforementioned "derivative of a maleimide compound having one or more N-substituted maleimide groups" include an addition reaction product between the aforementioned maleimide compound having one or more N-substituted maleimide groups and an amine compound, such as a diamine compound (a2) as mentioned later.

The component (A) may be used alone or may be used in combination of two or more thereof.

From the viewpoint of compatibility with other resin, adhesiveness to a conductor, and dielectric characteristics, the maleimide compound (A) is preferably one or more selected from the group consisting of:

(i) a maleimide compound (a1) having one or more N-substituted maleimide groups [hereinafter occasionally abbreviated simply as a maleimide compound (a1) or a component (a1)]; and (ii) an aminomaleimide compound having a structural unit derived from the maleimide compound (a1) and a structural unit derived from a diamine compound (a2) [hereinafter occasionally abbreviated simply as an aminomaleimide compound (A1) or a component (A1)].

(Maleimide Compound (a1))

Although the component (a1) is not particularly limited so long as it is a maleimide compound having one or more N-substituted maleimide groups, specific examples thereof include an aromatic maleimide compound having one N-substituted maleimide group preferably bonding to the aromatic ring in the molecule, such as N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, and N-benzylmaleimide; an aromatic bismaleimide having two N-substituted maleimide groups preferably bonding to the aromatic ring in the molecule, such as bis(4-maleimidophenyl)methane, bis(4-maleimidophenyl) ether, bis(4-maleimidophenyl)sulfone, 3,3'-dimethyl-5,5'-diethyl-4,4'-diphenylmethane bismaleimide, 4-methyl-1,3-phenylene bismaleimide, m-phenylene bismaleimide, and 2,2-bis[4-(4-maleimidophenoxy)phenyl]propane; an aromatic polymaleimide compound having three or more N-substituted maleimide groups preferably bonding to the aromatic ring in the molecule, such as polyphenylmethane maleimide and a biphenylaralkyl-type maleimide; and an aliphatic maleimide compound, such as N-dodecylmaleimide, N-isopropylmaleimide, N-cyclohexylmaleimide, 1,6-bismaleimido-(2,2,4-trimethyl)hexane, and a pyrophosphoric acid binder-type long chain alkyl bismaleimide. Of these, from the viewpoint of compatibility with other resin, adhesiveness to a conductor, heat resistance, low thermal expansion, and mechanical characteristics, an aromatic bismaleimide compound having two N-substituted maleimide groups in the molecule and an aromatic polymaleimide compound having three or more N-substituted maleimide groups in the molecule are preferred, an aromatic polymaleimide compound having three or more N-substituted maleimide groups in the molecule is more preferred, and a biphenylaralkyl-type maleimide is still more preferred. As the component (a1), especially preferred is at least one selected from the group consisting of bis(4-maleimidophenyl)methane, 2,2-bis[4-(4-maleimidophenoxy)phenyl]propane, 3,3'-dimethyl-5,5'-diethyl-4,4'-diphenylmethane bismaleimide and biphenylaralkyl-type maleimide.

The component (a1) may be used alone or may be used in combination of two or more thereof.

As the component (a1), a maleimide compound represented by the following general formula (a1-1) is preferred.

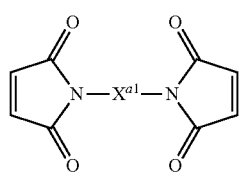

(a1-1)

In the formula, $X^{a1}$ is a divalent organic group.

$X^{a1}$ in the general formula (a1-1) is a divalent organic group and is corresponding to a residue of the component (a1). The residue of the component (a1) refers to a structure of a moiety of the component (a1) from which the N-substituted maleimide groups have been eliminated.

As the divalent organic group represented by $X^{a1}$, there is exemplified a group represented by the following general formula (a1-2), (a1-3), (a1-4), (a1-5), or (a1-6).

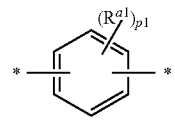

(a1-2)

In the formula, $R^{a1}$ is an aliphatic hydrocarbon group having 1 to 5 carbon atoms or a halogen atom; p1 is an integer of 0 to 4; and * indicates a binding site.

Examples of the aliphatic hydrocarbon group having 1 to 5 carbon atoms, which is represented by $R^{a1}$, include a methyl group, an ethyl group, an n-propyl group, an isopropyl group, an n-butyl group, an isobutyl group, a t-butyl group, and an n-pentyl group. The aliphatic hydrocarbon group may be an aliphatic hydrocarbon group having 1 to 3 carbon atoms, or may be a methyl group.

Examples of the halogen atom include a fluorine atom, a chlorine atom, a bromine atom, and an iodine atom.

p1 is an integer of 0 to 4, and from the viewpoint of easiness of availability, p1 may be an integer of 0 to 2, may be 0 or 1, or may be 0. In the case where p1 is an integer of 2 or more, plural $R^{a1}$'s may be the same as or different from each other.

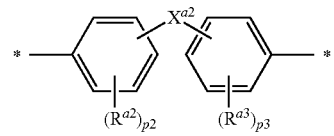

(a1-3)

In the formula, $R^{a2}$ and $R^{a3}$ are each independently an aliphatic hydrocarbon group having 1 to 5 carbon atoms or a halogen atom; $X^{a2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (a1-3-1); p2 and p3 are each independently an integer of 0 to 4; and * indicates a binding site.

Examples of the aliphatic hydrocarbon group having 1 to 5 carbon atoms and the halogen atom, which are represented by $R^{a2}$ and $R^{a3}$, include the same examples as in the case of $R^{a1}$. The aliphatic hydrocarbon group may be an aliphatic hydrocarbon group having 1 to 3 carbon atoms, may be a methyl group or an ethyl group, or may be an ethyl group.

Examples of the alkylene group having 1 to 5 carbon atoms, which is represented by $X^{a2}$, include a methylene group, a 1,2-dimethylene group, a 1,3-trimethylene group, a 1,4-tetramethylene group, and a 1,5-pentamethylene group. From the viewpoint of compatibility with other resin, adhesiveness to a conductor, heat resistance, low thermal expansion, and mechanical characteristics, the foregoing alkylene group may be an alkylene group having 1 to 3 carbon atoms, or may be a methylene group.

Examples of the alkylidene group having 2 to 5 carbon atoms, which is represented by $X^{a2}$, include an ethylidene group, a propylidene group, an isopropylidene group, a butylidene group, an isobutylidene group, a pentylidene group, and an isopentylidene group. Of these, from the viewpoint of compatibility with other resin, adhesiveness to a conductor, heat resistance, low thermal expansion, and mechanical characteristics, the foregoing alkylidene group may be an isopropylidene group.

Among the aforementioned options, $X^{a2}$ may be an alkylene group having 1 to 5 carbon atoms or an alkylidene group having 2 to 5 carbon atoms.

p2 and p3 are each independently an integer of 0 to 4, and from the viewpoint of easiness of availability, any of them may be an integer of 0 to 2, or may be 0 or 2. In the case where p2 or p3 is an integer of 2 or more, plural $R^{a2}$'s or plural $R^{a3}$'s may be the same as or different from each other.

The divalent group represented by the general formula (a1-3-1), which is represented by $X^{a2}$, is as follows.

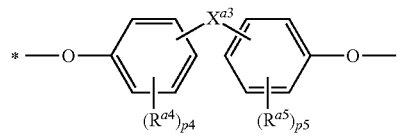

(a1-3-1)

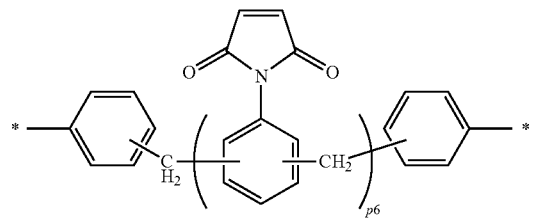

(a1-4)

In the formula, p6 is an integer of 0 to 10; and * indicates a binding site.

From the viewpoint of easiness of availability, p6 may be an integer of 0 to 5, or may be an integer of 0 to 3.

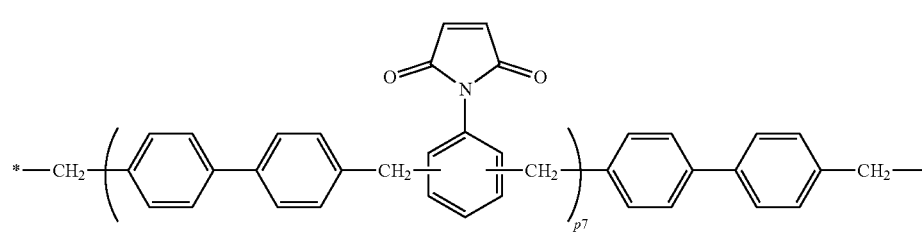

(a1-5)

In the formula, $R^{a4}$ and $R^{R5}$ are each independently an aliphatic hydrocarbon group having 1 to 5 carbon atoms or a halogen atom; $X^{a3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; p4 and p5 are each independently an integer of 0 to 4; and * indicates a binding site.

As the aliphatic hydrocarbon group having 1 to 5 carbon atoms and a halogen atom, which are represented by $R^{a4}$ and $R^{a5}$, the same explanation as in the case of $R^{a1}$ is made.

Examples of the alkylene group having 1 to 5 carbon atoms and the alkylidene group having 2 to 5 carbon atoms, which are represented by $X^{a3}$, include the same examples as in the alkylene group having 1 to 5 carbon atoms and the alkylidene group having 2 to 5 carbon atoms, which are represented by $X^{a2}$.

As $X^{a3}$, an alkylidene group having 2 to 5 carbon atoms may be selected from the aforementioned options.

p4 and p5 are each independently an integer of 0 to 4, and from the viewpoint of easiness of availability, any of them may be an integer of 0 to 2, may be 0 or 1, or may be 0. In the case where p4 or p5 is an integer of 2 or more, plural $R^{a4}$'s or plural $R^{a5}$'s may be the same as or different from each other.

In the formula, p7 is an integer of 0 to 5; and * indicates a binding site.

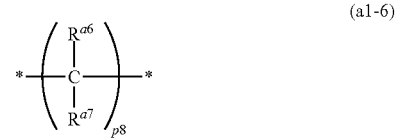

(a1-6)

In the formula, $R^{a6}$ and $R^{a7}$ are each independently a hydrogen atom or an aliphatic hydrocarbon group having 1 to 5 carbon atoms; p8 is an integer of 1 to 8; and * indicates a binding site.

As the aliphatic hydrocarbon group having 1 to 5 carbon atoms, which are represented by $R^{a6}$ and $R^{a7}$, the same explanation as in the case of $R^{a1}$ is made.

p8 is an integer of 1 to 8, may be an integer of 1 to 3, or may be 1.

In the case where p8 is an integer of 2 or more, plural $R^{a6}$'s or plural $R^{a7}$'s may be the same as or different from each other.

(Aminomaleimide Compound (A1))

The aminomaleimide compound (A1) is an aminomaleimide compound having a structural unit derived from the maleimide compound (a1) and a structural unit derived from the diamine compound (a2). The component (a1) is preferably a bismaleimide compound having two N-substituted maleimide groups preferably on the aromatic ring in the molecule, or a polymaleimide compound having three or more N-substituted maleimide groups preferably on the aromatic ring in the molecule, more preferably, as in the description of the maleimide compound (a1), an aromatic bismaleimide compound having two N-substituted maleimide groups preferably on the aromatic ring in the molecule, or an aromatic polymaleimide compound having three or more N-substituted maleimide groups preferably on the aromatic ring in the molecule.

The component (A1) may be used alone or may be used in combination of two or more thereof.

Examples of the structural unit derived from the component (a1) include one or more selected from the group consisting of a group represented by the following general formula (a1-7) and a group represented by the following general formula (a1-8).

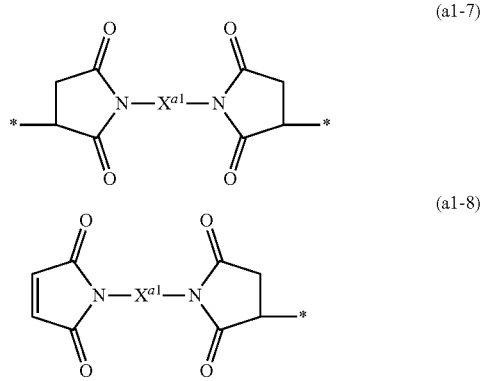

In the formulae, $X^{a1}$ is a divalent organic group; and * indicates a binding position with other structure.

The explanation regarding $X^{a1}$ in the general formula (a1-7) and the general formula (a1-8) is the same as in the explanation regarding $X^{a1}$ in the general formula (a1-1).

The total content of the structural unit derived from the component (a1) in the aminomaleimide compound (A1) is preferably 5 to 95% by mass, more preferably 30 to 93% by mass, still more preferably 60 to 90% by mass, and especially preferably 75 to 90% by mass. When the content of the structural unit derived from the component (a1) falls within the aforementioned range, there is a tendency that not only the dielectric characteristics in a high-frequency band of 10 GHz or higher become more favorable, but also favorable film handling properties are obtained.

The component (a2) is not particularly limited so long as it is a compound having two amino groups.

Examples of the component (a2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis[1-[4-(4-aminophenoxy)phenyl]-1-methylethyl]benzene, 1,4-bis[1-[4-(4-aminophenoxy)phenyl]-1-methylethyl]benzene, 4,4'-[1,3-phenylene bis(1-methylethylidene)]bisaniline, 4,4'-[1,4-phenylene bis(1-methylethylidene)]bisaniline, 3,3'-[1,3-phenylene bis(1-methylethylidene)]bisaniline, bis[4-(4-aminophenoxy)phenyl]sulfone, bis[4-(3-aminophenoxy)phenyl]sulfone, and 9,9-bis(4-aminophenyl)fluorene.

The component (a2) may be used alone or may be used in combination of two or more thereof.

Of these, the component (a2) is preferably 4,4'-diaminodiphenylmethane, 4,4'-diamino-3,3'-dimethyldiphenylmethane, 4,4'-diamino-3,3'-diethyldiphenylmethane, 2,2-bis[4-(4-aminophenoxy)phenyl]propane, 4,4'-[1,3-phenylene bis (1-methylethylidene)]bisaniline, or 4,4'-[1,4-phenylene bis (1-methylethylidene)]bisaniline from the viewpoint that it is excellent in solubility in an organic solvent, reactivity with the component (a1), and heat resistance. The component (a2) is preferably 3,3'-dimethyl-5,5'-diethyl-4,4'-diaminodiphenylmethane from the viewpoint that it is excellent in dielectric characteristics and low water absorbency. The component (a2) is preferably 2,2-bis[4-(4-aminophenoxy) phenyl]propane from the viewpoint that it is excellent in high adhesiveness to a conductor and mechanical characteristics, such as elongation and breaking strength. Furthermore, the component (a2) is preferably 4,4'-[1,3-phenylene bis(1-methylethylidene)]bisaniline or 4,4'-[1,4-phenylene bis(1-methylethylidene)]bisaniline from the viewpoint that it is excellent in solubility in an organic solvent, reactivity at the time of synthesis, heat resistance, and high adhesiveness to a conductor, and in addition to that, it is excellent in dielectric characteristics and low hygroscopicity.

Examples of the structural unit derived from the component (a2) include one or more selected from the group consisting of a group represented by the following general formula (a2-1) and a group represented by the following general formula (a2-2).

In the formulae, $X^{a4}$ is a divalent organic group; and * indicates a binding position with other structure.

$X^{a4}$ in the general formulae (a2-1) and (a2-2) is a divalent organic group and is corresponding to a residue of the component (a2). The residue of the component (a2) refers to a structure of a moiety of the component (a2) from which the functional group provided for binding, namely an amino group has been eliminated.

$X^{a4}$ in the general formula (a2-1) and the general formula (a2-2) is preferably a divalent group represented by the following general formula (a2-3).

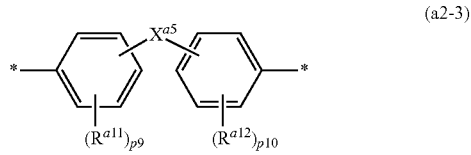

In the formula, $R^{a11}$ and $R^{a12}$ are each independently an aliphatic hydrocarbon group having 1 to 5 carbon atoms, an alkoxy group having 1 to 5 carbon atoms, a hydroxy group, or a halogen atom; $X^{a5}$ is an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a divalent group represented by the following general formula (a2-3-1) or (a2-3-2). p9 and p10 are each independently an integer of 0 to 4; and * indicates a binding site.

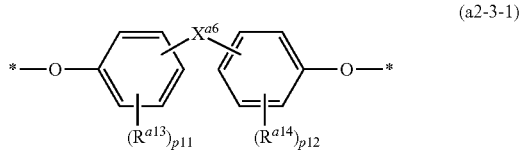

(a2-3-1)

In the formula, $R^{a13}$ and $R^{a14}$ are each independently an aliphatic hydrocarbon group having 1 to 5 carbon atoms or a halogen atom; $X^{a6}$ is an alkylene group having 1 to 5 carbon atoms, an alkylidene group having 2 to 5 carbon atoms, a m-phenylenediisopropylidene group, a p-phenylenediisopropylidene group, an ether group, a sulfide group, a sulfonyl group, a carbonyloxy group, a keto group, or a single bond.

p11 and p12 are each independently an integer of 0 to 4; and * indicates a binding site.

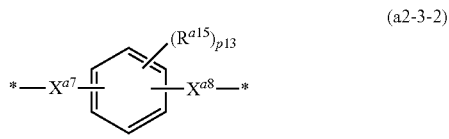

(a2-3-2)

In the formula, $R^{a15}$'s are each independently an aliphatic hydrocarbon group having 1 to 5 carbon atoms or a halogen atom; $X^{a7}$ and $X^{a8}$ are each independently an alkylene group having 1 to 5 carbon atoms, an alkylidene group having 2 to 5 carbon atoms, an ether group, a sulfide group, a sulfonyl group, a carbonyloxy group, a keto group, or a single bond. p13 is an integer of 0 to 4; and * indicates a binding site.

In the general formula (a2-3), (a2-3-1), or (a2-3-2), examples of the aliphatic hydrocarbon group having 1 to 5 carbon atoms or the halogen atom, which is represented by $R^{a11}$, $R^{a12}$, $R^{a13}$, $R^{a14}$, and $R^{a15}$, include the same examples as in $R^{a1}$ in the general formula (a1-2). The foregoing aliphatic hydrocarbon group may be an aliphatic hydrocarbon group having 1 to 3 carbon atoms, or may be a methyl group or an ethyl group.

As the alkylene group having 1 to 5 carbon atoms and the alkylidene group having 2 to 5 carbon atoms, which are represented by $X^{a5}$ in the general formula (a2-3), $X^{a6}$ in the general formula (a2-3-1), and $X^{a7}$ and $X^{a8}$ in the general formula (a2-3-2), the same explanation as in the case of $X^{a2}$ in the general formula (a1-3) is made.

p9 and p10 in the general formula (a2-3) are each independently an integer of 0 to 4, and from the viewpoint of easiness of availability, any of them may be an integer of 0 to 2, or may be 0 or 2. In the case where p9 or p10 is an integer of 2 or more, plural $R^{a11}$'s or plural $R^{a12}$'s may be the same as or different from each other.

p11 and p12 in the general formula (a2-3-1) are each independently an integer of 0 to 4, and from the viewpoint of easiness of availability, any of them may be an integer of 0 to 2, may be 0 or 1, or may be 0. In the case where p11 or p12 is an integer of 2 or more, plural $R^{a13}$'s or plural $R^{a14}$'s may be the same as or different from each other.

p13 in the general formula (a2-3-2) is an integer of 0 to 4, and from the viewpoint of easiness of availability, p13 may be an integer of 0 to 2, or may be 0. In the case where p13 is an integer of 2 or more, plural $R^{a15}$'s may be the same as or different from each other.

The total content of the structural unit derived from the component (a2) in the aminomaleimide compound (A1) is preferably 5 to 95% by mass, more preferably 7 to 70% by mass, still more preferably 10 to 40% by mass, and especially preferably 10 to 25% by mass. When the total content of the structural unit derived from the component (a2) falls within the aforementioned range, there is a tendency that not only the dielectric characteristics are excellent, but also more favorable heat resistance, flame retardancy, and glass transition temperature are obtained.

The content ratio of the structural unit derived from the component (a1) and the structural unit derived from the component (a2) in the aminomaleimide compound (A1) is a content ratio such that an equivalent ratio (Ta2/Ta1) of a total equivalent (Ta2) of the —NH 2 group-derived group (also including —NH 2) of the component (a2) to a total equivalent (Ta1) of the N-substituted maleimide group-derived group (also including the N-substituted maleimide group) of the component (a1) in the aminomaleimide compound (A1) is preferably 0.05 to 10, and more preferably 1 to 5. When the equivalent ratio (Ta2/Ta1) falls within the aforementioned range, there is a tendency that not only the dielectric characteristics are excellent, but also more favorable heat resistance, flame retardancy, and glass transition temperature are obtained.

From the viewpoint of dielectric characteristics as well as the viewpoint of solubility in an organic solvent, high adhesiveness to a conductor, moldability of a resin film, and so on, the aminomaleimide compound (A1) preferably contains an aminomaleimide compound represented by the following general formula (a2-4).

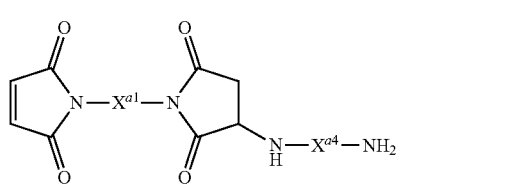

(a2-4)

In the formula, $X^{a1}$ and $X^{a4}$ are those as explained above.

(Production Method of Aminomaleimide Compound (A1))

The component (A1) can be, for example, produced by allowing the component (a1) and the component (a2) to react with each other in an organic solvent.

On the occasion of allowing the component (a1) and the component (a2) to react with each other to produce the aminomaleimide compound (A1), a reaction catalyst can be used, as required.

Although the reaction catalyst is not particularly limited, examples thereof include an acidic catalyst, such as p-toluenesulfonic acid; an amine, such as triethylamine, pyridine, and tributylamine; an imidazole, such as methylimidazole and phenylimidazole; and a phosphorus-based catalyst, such as triphenylphosphine. These may be used alone or may be used in combination of two or more thereof.

Although a blending amount of the reaction catalyst is not particularly limited, for example, the reaction catalyst may be used in an amount of 0.01 to 5 parts by mass relative to 100 parts by mass of a total amount of the component (a1) and the component (a2).

When predetermined amounts of the component (a1) and the component (a2), and optionally, other component are put in a reaction vessel, and the component (a1) and the component (a2) are subjected to a Michael addition reaction, the aforementioned aminomaleimide compound is obtained. Although the reaction conditions in this step are not particularly limited, for example, from the viewpoint of workability, such as reaction rate, inhibition of gelling during the reaction, and so on, a reaction temperature is preferably 50 to 160° C., and a reaction time is preferably 1 to 10 hours.

In addition, in this step, the concentration of the solid components of reaction raw materials and the viscosity of the solution can be adjusted by addition of an organic solvent or by concentration. Although the concentration of the solid components of the reaction raw materials is not particularly limited, for example, it is preferably 10 to 90% by mass, and more preferably 20 to 80% by mass. When the concentration of the solid components of the reaction raw materials is 10% by mass or more, there is a tendency that the reaction rate does not become excessively slow, and such becomes advantageous in terms of the production cost. In addition, when the concentration of the solid components of the reaction raw materials is 90% by mass or less, there is a tendency that more favorable solubility is obtained, stirring efficiency becomes favorable, and gelling becomes difficult.

Although a number average molecular weight of the aminomaleimide compound (A1) is not particularly limited, it is preferably 400 to 10,000, more preferably 500 to 5,000, still more preferably 600 to 2,000, and especially preferably 700 to 1,500.

The number average molecular weight in this description means a value measured by gel permeation chromatography (GPC) as expressed in terms of polystyrene, and specifically, it can be measured by the method described in the Examples.

<Modified Conjugated Diene Polymer (B)>

The modified conjugated diene polymer (B) is one resulting from modification of (b1) a conjugated diene polymer having a vinyl group in the side chain with (b2) a maleimide compound having two or more N-substituted maleimide groups.

The component (B) may be used alone or may be used in combination of two or more thereof.

((b1) Conjugated Diene Polymer Having a Vinyl Group in the Side Chain)

Although the component (b1) is not particularly limited so long as it is a conjugated diene polymer having a vinyl group in the side chain, it is preferably a conjugated diene polymer having plural vinyl groups in the side chain.

The number of vinyl groups which the component (b1) has in one molecule thereof is preferably 3 or more, more preferably 5 or more, and still more preferably 10 or more from the viewpoint of dielectric characteristics and heat resistance.

The component (b1) may be used alone or may be used in combination of two or more thereof.

In this description, the conjugated diene polymer means a polymer of a conjugated diene compound.

Examples of the conjugated diene compound include 1,3-butadiene, isoprene, 1,3-pentadiene, 2,3-dimethyl-1,3-butadiene, 2-phenyl-1,3-butadiene, and 1,3-hexadiene.

The conjugated diene polymer may be a polymer of a single conjugated diene compound or may be a polymer of two or more conjugated diene compounds.

The conjugated diene polymer may also be a copolymer of one or more conjugated diene compounds with one or more monomers other than the conjugated diene compound. In that case, the polymerization mode is not particularly limited, and it may be any of random polymerization, block polymerization, and graft polymerization.

Specific examples of the component (b1) include a polybutadiene having a 1,2-vinyl group, a butadiene-styrene copolymer having a 1,2-vinyl group, and a polyisoprene having a 1,2-vinyl group. Of these, from the viewpoint of dielectric characteristics and heat resistance, a polybutadiene having a 1,2-vinyl group and a butadiene-styrene copolymer having a 1,2-vinyl group are preferred, and a polybutadiene having a 1,2-vinyl group is more preferred. In addition, the polybutadiene having a 1,2-vinyl group is preferably a butadiene homopolymer having a 1,2-vinyl group.

The 1,2-vinyl group derived from butadiene, which the component (31) has, is a vinyl group contained in the butadiene-derived structural unit represented by the following formula (b1-1).

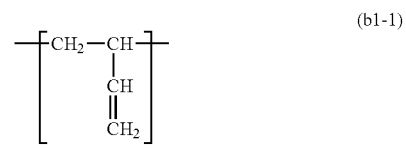

In the case where the component (b1) is a polybutadiene having a 1,2-vinyl group, the content of the structural unit having a 1,2-vinyl group (the structural unit represented by the general formula (b1-1)) [the foregoing content will be hereinafter occasionally abbreviated as "vinyl group content"] relative to the total structural units derived from butadiene constituting the polybutadiene is preferably 50 mol % or more, more preferably 60 mol % or more, still more preferably 70 mol % or more, especially preferably 80 mol % or more, and most preferably 85 mol % or more from the viewpoint of compatibility with other resin, dielectric characteristics, low thermal expansion, and heat resistance. In addition, the upper limit of the vinyl group content is not specifically limited, and may be 100 mol % or less.

From the same viewpoint, the polybutadiene having a 1,2-vinyl group is preferably a 1,2-polybutadiene homopolymer.

A number average molecular weight of the component (b1) is preferably 400 to 4,000, more preferably 500 to 3,500, and can be 2,000 to 3,500, can be 600 to 2,000, or can be 700 to 1,500, from the viewpoint of compatibility with other resin, dielectric characteristics, low thermal expansion, and heat resistance.

((b2) Maleimide Compound Having Two or More N-Substituted Maleimide Groups)

The component (b2) may be a maleimide compound having two or more N-substituted maleimide groups, and those exemplified for the aforementioned maleimide compound (A) can be used.

The component (b2) may be used alone or may be used in combination of two or more thereof.

Of these, from the viewpoint of solubility in an organic solvent and inhibition of gelling during the reaction as well as the viewpoint of compatibility of the resultant component (B) with other resin, dielectric characteristics, low thermal expansion, and heat resistance, the component (b2) is, as in the description of the maleimide compound (a1), preferably at least one selected from the group consisting of an aromatic bismaleimide compound having two N-substituted maleimide groups preferably on the aromatic ring in the molecule, and an aromatic polymaleimide compound having three or more N-substituted maleimide groups preferably on the aromatic ring in the molecule, more preferably an aromatic bismaleimide compound having two N-substituted maleimide group on the ring in the molecule, and even more preferably a maleimide compound represented by the general formula (a1-1). In particular, the component (b2) is, from the same viewpoint as above, preferably an aromatic maleimide compound substituted with an aliphatic hydrocarbon group, more preferably a compound represented by the following general formula (b2-1).

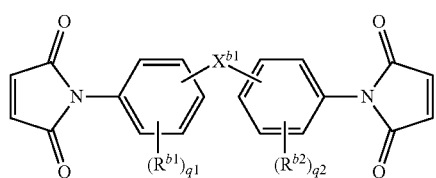

(b2-1)

In the formula, $R^{b1}$ and $R^{b2}$ are each independently an aliphatic hydrocarbon group having 1 to 5 carbon atoms; $X^{b1}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (b2-1-1); and q1 and q2 are each independently an integer of 0 to 4.

Examples of the aliphatic hydrocarbon group having 1 to 5 carbon atoms, which is represented by $R^{b1}$ and $R^{b2}$, include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, more preferably an alkyl group having 1 to 3 carbon atoms, and still more preferably an ethyl group or a methyl group from the viewpoint of compatibility with other resin and inhibition of gelling during the reaction.

Examples of the alkylene group having 1 to 5 carbon atoms, which is represented by $X^{b1}$, include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms, and more preferably a methylene group.

Examples of the alkylidene group having 2 to 5 carbon atoms, which is represented by $X^{b1}$, include an ethylidene group, a propylidene group, an isopropylidene group, a butylidene group, an isobutylidene group, a pentylidene group, and an isopentylidene group.

q1 and q2 are each independently an integer of 0 to 4. From the viewpoint of easiness of availability, compatibility with other resin, and inhibition of gelling during the reaction, q1 and q2 are each preferably an integer of 0 to 2, and can be 0, or from the viewpoint of compatibility with other resin and inhibition of gelling during the reaction, q1+q2 is preferably an integer of 1 or more, q1 and q2 each are more preferably 1 or 2, and even more preferably each are 2. In the case where q1 or q2 is an integer of 2 or more, plural $R^{b1}$'s and $R^{b2}$'s each can be the same as or different from each other.

The divalent group represented by the general formula (b2-1-1), which is represented by $X^{b1}$, is as follows.

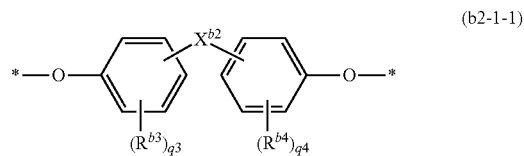

(b2-1-1)

In the formula, $R^{b3}$ and $R^{b4}$ are each independently an aliphatic hydrocarbon group having 1 to 5 carbon atoms or a halogen atom; $X^{b2}$ is an alkylene group having 1 to 5 carbon atoms, an alkylidene group having 2 to 5 carbon atoms, an ether group, a sulfide group, a sulfonyl group, a carbonyloxy group, a keto group, or a single bond; q3 and q4 are each independently an integer of 0 to 4; and * indicates a binding site.

As the aliphatic hydrocarbon group having 1 to 5 carbon atoms and a halogen atom, which are represented by $R^{b3}$ and $R^{b4}$, the same explanation as in the case of $R^{b1}$ is made.

Examples of the alkylene group having 1 to 5 carbon atoms and the alkylidene group having 2 to 5 carbon atoms, which are represented by $X^{b2}$, include the same examples as in the alkylene group having 1 to 5 carbon atoms and the alkylidene group having 2 to 5 carbon atoms, which are represented by $X^{b1}$.

q3 and q4 are each independently an integer of 0 to 4, and from the viewpoint of easiness of availability, any of them may be an integer of 0 to 2, may be 0 or 1, or may be 0. In the case where q3 or q4 is an integer of 2 or more, plural $R^{b3}$'s or plural $R^{b4}$'s may be the same as or different from each other.

Examples of the compound represented by the general formula (b2-1) include 3,3'-dimethyl-5,5'-diethyl-4,4'-diphenylmethane bismaleimide and 2,2-bis[4-(4-maleimidophenoxy)phenyl]propane 4. Of these, from the viewpoint of solubility in an organic solvent and inhibition of gelling during the reaction as well as the viewpoint of compatibility of the obtained component (B) with other resin, dielectric characteristics, low thermal expansion, and heat resistance, 3,3'-dimethyl-5,5'-diethyl-4,4'-diphenylmethane bismaleimide is preferred.

As the component (b2), 4-methyl-1,3-phenylenebismaleimide, 4,4'-diphenylmethanebismaleimide and the like can also be preferably used in addition to the compound represented by the general formula (b2-1).

(Reaction Conditions)

A method for allowing the component (b1) and the component (b2) to react with each other is not particularly limited, and the component (B) can be, for example, obtained by charging predetermined amounts of the component (b1), the component (b2), a reaction catalyst, and an organic solvent in a reaction vessel and performing the reaction while heating, heat insulation, stirring, and the like, as required. Although the reaction conditions in this step can be appropriately controlled according to the kinds of the raw materials to be used, etc., from the viewpoint of workability and inhibition of gelling during the reaction, a reaction temperature is preferably 70 to 120° C., more preferably 80 to 110° C., and still more preferably 85 to 105° C., and a reaction time is preferably 0.5 to 15 hours, more preferably 1 to 10 hours, and still more preferably 3 to 7 hours.

Although the organic solvent which is used for the reaction is not particularly limited, examples thereof include an alcohol, such as methanol, ethanol, butanol, butyl cellosolve, ethylene glycol monomethyl ether, and propylene glycol monomethyl ether; a ketone, such as acetone, methyl ethyl ketone, methyl isobutyl ketone, and cyclohexanone; an aromatic hydrocarbon, such as toluene, xylene, and mesitylene; an ester, such as methoxyethyl acetate, ethoxyethyl acetate, butoxyethyl acetate, and ethyl acetate; and a nitrogen-containing compound, such as N,N-dimethylformamide, N,N-dimethylacetamide, and N-methyl-2-pyrrolidone. These may be used alone or may be used in combination of two or more thereof. Of these, from the viewpoint of resin solubility, toluene is preferred.

In the case where the aforementioned reaction is performed in an organic solvent, though the total content of the component (b1) and the component (b2) in the reaction liquid is not particularly limited, it is preferably 10 to 70% by mass, more preferably 15 to 60% by mass, and still more preferably 20 to 50% by mass. When the aforementioned total content is 10% by mass or more, there is a tendency that the reaction rate does not become excessively slow, and such becomes more advantageous in terms of the production cost. In addition, when the aforementioned total content is 70% by mass or less, there is a tendency that not only more favorable solubility is obtained, but also the solution viscosity is low so that stirring efficiency is well, and gelling can be more likely inhibited.

As the reaction catalyst, those exemplified for a curing accelerator (F) as mentioned later can be used. Of these, from the viewpoint of obtaining sufficient reactivity while inhibiting gelling during the reaction, an organic peroxide is preferred, and α,α'-bis(t-butylperoxy)diisopropylbenzene is more preferred.

The reaction catalyst may be used alone or may be used in combination of two or more thereof.

Although a use amount of the reaction catalyst is not particularly limited, it is preferably 0.01 to 1.2 parts by mass, more preferably 0.03 to 1.0 part by mass, and still more preferably 0.05 to 0.8 parts by mass relative to 100 parts by mass of the total amount of the component (b1) and the component (b2).

On the occasion of performing the aforementioned reaction, a blending amount of the component (b1) and the component (b2) is an amount such that a ratio $(M_m/M_v)$ of the molar number $(M_m)$ of the N-substituted maleimide group which the component (b2) has to the molar number $(M_v)$ of the side chain vinyl group which the component (b1) has is preferably 0.01 to 0.5, more preferably 0.02 to 0.4, and still more preferably 0.04 to 0.3, from the viewpoint of compatibility of the obtained component (B) with other resin and inhibition of gelling during the reaction.

According to the aforementioned reaction, at least a part of the vinyl group which the component (b1) has in the side chain reacts with the N-substituted maleimide group which the component (b2) has, whereby the component (B) is produced.

The obtained component (B) is one having a substituent (x) resulting from reaction between the vinyl group which the component (b1) has and the N-substituted maleimide group which the component (b2) has.

From the viewpoint of compatibility with other resin, dielectric characteristics, low thermal expansion, and heat resistance, the substituent (x) is preferably a group containing a structure represented by the following general formula (B-11) or (B-12) as the structure derived from the component (b2).

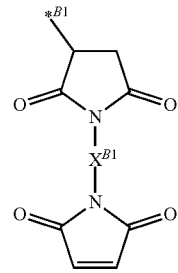

(B-11)

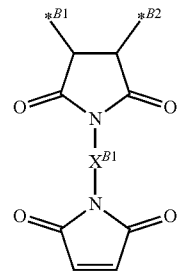

(B-12)

In the formulae, $X^{B1}$ is a divalent organic group; $*^{B1}$ is a site binding with a carbon atom derived from the vinyl group which the component (b1) has; and $*^{B2}$ is a site binding with other atom.

The explanation regarding $X^{B1}$ in the general formulae (B-11) and (B-12) is the same as in the explanation regarding $X^{a1}$ in the general formula (a1-1).

$*^{B2}$ is a site binding with other atom, and is, for example but though not specifically limited thereto, a site biding with the carbon atom derived from the N-substituted maleimide group which the component (b2) has (that is, this corresponding to the case where the components (b2) bind with each other), and the like.

From the viewpoint of compatibility with other resin, dielectric characteristics, low thermal expansion, and heat resistance, the substituent (x) is also preferably a group containing a structure of the general formula (B-11) and (B-12) where $X^{B1}$ is a phenylene group or a phenylene group substituted with an aliphatic hydrocarbon group, as the structure derived from the component (b2), but is more preferably a group containing a structure represented by the following general formula (B-21) or (B-22).

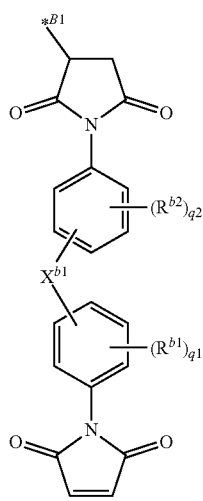

(B-21)

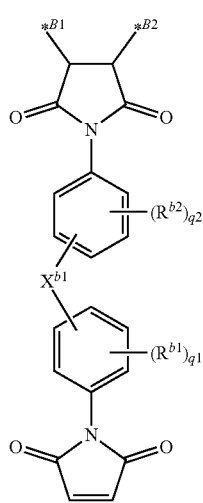

(B-22)

In the formulae, the explanation regarding $R^{b1}$, $R^{b2}$, $X^{b1}$, q1, and q2 is the same as in the explanation in the general formula (b2-1); and the explanation regarding $*^{B1}$ and $*^{B2}$ is the same as in the explanation in the general formulae (B-11) and (B-12).

The component (B) preferably has the substituent (x) and the vinyl group (y) in the side chain. In that case, the vinyl group (y) is preferably a 1,2-vinyl group which the butadiene-derived structural unit has.

How much the substituent (x) is present in the component (B) can be used as an index of how much the vinyl group in the component (b1) is modified with the component (b2) (hereinafter this may be referred to as "vinyl group modification ratio"). The vinyl group modification ratio is, from the viewpoint of compatibility with other resin, dielectric characteristics, low thermal expansion, and heat resistance, preferably 1% or more, that is, 1 to 100%, more preferably 1 to 95%, even more preferably 5 to 85%, further more preferably 10 to 80%, further more preferably, and is most preferably 35 to 75%.

Here, the vinyl group modification ratio is a value determined according to the method described in Examples.

Although a number average molecular weight of the component (B) is not particularly limited, it is preferably 700 to 6,000, more preferably 800 to 5,000, still more preferably 900 to 4,500, and especially preferably 1,000 to 4,000 from the viewpoint of compatibility with other resin, dielectric characteristics, low thermal expansion, and heat resistance.

<Thermoplastic Elastomer (C)>

The thermoplastic elastomer (C) other than the component (B) includes a polyphenylene ether, a styrene-based thermoplastic elastomer, a urethane-based elastomer, a polyester elastomer, a polyamide elastomer, an acrylic elastomer, and a silicone elastomer. Of these, a styrene-based thermoplastic elastomer is preferred because there is a tendency that the resulting resin composition becomes favorable in dielectric characteristics, moldability, adhesiveness to a conductor, solder heat resistance, glass transition temperature, thermal expansion coefficient, and flame retardancy, and a balance among them becomes good.

The styrene-based thermoplastic elastomer is not particularly restricted so long as it is a thermoplastic elastomer having a styrene-based compound-derived structural unit, and it may be one having a styrene-derived structural unit represented by the following general formula (c-1).

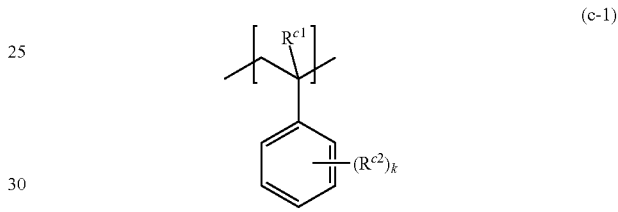

(c-1)

In the formula, $R^{c1}$ is a hydrogen atom or an alkyl group having 1 to 5 carbon atoms; $R^{c2}$ is an alkyl group having 1 to 5 carbon atoms; and k is an integer of 0 to 5.

Examples of the alkyl group having 1 to 5 carbon atoms, which is represented by $R^{c1}$ and $R^{c2}$, include a methyl group, an ethyl group, and an n-propyl group, and the foregoing alkyl group may be an alkyl group having 1 to 3 carbon atoms, or may be a methyl group.

k may be an integer of 0 to 2, may be 0 or 1, or may be 0.

Examples of the structural unit other than the styrene-based compound-derived structural unit, which the component (C) has, include a butadiene-derived structural unit, an isoprene-derived structural unit, a maleic acid-derived structural unit, and a maleic anhydride-derived structural unit. Of these, preferred is one or more selected from a butadiene-derived structural unit and an isoprene-derived structural unit, and more preferred is a butadiene-derived structural unit.

The component (C) may be used alone or may be used in combination of two or more thereof.

The aforementioned butadiene-derived structural unit and the aforementioned isoprene-derived structural unit may be hydrogenated. In the case of being hydrogenated, the butadiene-derived structural unit becomes a structural unit in which a butadiene unit and a butylene unit are mixed, or a structural unit in which an ethylene unit and a butylene unit are mixed, and the isoprene structural unit becomes a structural unit in which an ethylene unit and a propylene unit are mixed.

From the viewpoint of dielectric characteristics, adhesiveness to a conductor, heat resistance, glass transition temperature, and thermal expansion coefficient, the component (C) is preferably one or more selected from the group consisting of a hydrogenation product of a styrene-butadiene-styrene block copolymer (for example, SBBS and SEBS), a hydrogenation product of a styrene-isoprene-styrene block copolymer (SEPS), and a styrene-maleic anhydride copolymer (SMA).

Here, the hydrogenation product of a styrene-butadiene-styrene block copolymer includes SBBS where 60 to 85% of the carbon-carbon double bond of the 1,2-binding site in the butadiene block has been hydrogenated, and SEBS where the hydrogenation ratio of the carbon-carbon double bond is generally 90% or more.

From the viewpoint of dielectric characteristics, adhesiveness to a conductor, heat resistance, glass transition temperature, and thermal expansion coefficient, the component (C) is preferably one or more selected from the group consisting of a hydrogenation product of a styrene-butadiene-styrene block copolymer (SEBS) and a hydrogenation product of a styrene-isoprene-styrene block copolymer (SEPS); and still more preferably a hydrogenation product of a styrene-butadiene-styrene block copolymer (SEBS).

In the aforementioned SEBS, the content of the styrene-derived structural unit [hereinafter occasionally abbreviated as "styrene content"] is preferably 5 to 80% by mass, more preferably 10 to 75% by mass, still more preferably 15 to 70% by mass, and especially preferably 20 to 50% by mass from the viewpoint of dielectric characteristics, adhesiveness to a conductor, heat resistance, glass transition temperature, and thermal expansion coefficient. Although a melt flow rate (MFR) of the SEBS is not particularly limited, it may be 0.1 to 20 g/10 min, or may be 0.5 to 15 g/10 min under measurement conditions of 230° C. and a load of 2.16 kgf (21.2 N).

Examples of a commercially available product of the SEBS include TUFTEC (registered trademark) H Series and M Series, manufactured by Asahi Kasei Corporation; SEPTON (registered trademark) Series, manufactured by Kuraray Co., Ltd.; and KRATON (registered trademark) G Polymer Series, manufactured by Kraton Polymers Japan Ltd.

Although a weight average molecular weight (Mw) of the component (C) is not particularly limited, it is preferably 12,000 to 1,000,000, more preferably to 500,000, still more preferably 50,000 to 120,000, and especially preferably 70,000 to 100,000. The weight average molecular weight (Mw) is measured by gel permeation chromatography (GPC) as expressed in terms of polystyrene.

<Content of Components (A), (B) and (C), and Content Ratio Thereof>

In the resin composition of the present embodiment, relative to 100 parts by mass of the total content of the components (A) to (C), the content of the component (A) can be 10 to 90 parts by mass, the content of the component (B) can be 1 to 50 parts by mass and the content of the component (C) can be 5 to 60 parts by mass.

In the resin composition of the present embodiment, the content of the component (A) is, from the viewpoint of dielectric characteristics and moldability, preferably 10 to 90 parts by mass, more preferably 20 to 80 parts by mass, even more preferably 30 to 70 parts by mass, especially preferably 35 to 60 parts by mass relative to 100 parts by mass of the total content of the components (A) to (C).

In the resin composition of the present embodiment, the content of the component (B) is, from the viewpoint of compatibility with other resin, dielectric characteristics, low thermal expansion and heat resistance, preferably 1 to 50 parts by mass, more preferably 5 to 40 parts by mass, even more preferably 10 to parts by mass, further more preferably 10 to 25 parts by mass relative to 100 parts by mass of the total content of the components (A) to (C).

In the resin composition of the present embodiment, the content of the component (C) is, from the viewpoint of dielectric characteristics, adhesiveness to a conductor, heat resistance, glass transition temperature and thermal expansion coefficient, preferably 5 to 60 parts by mass, more preferably 10 to 55 parts by mass, even more preferably 15 to 50 parts by mass, further more preferably 20 to parts by mass, and most preferably 25 to 40 parts by mass relative to 100 parts by mass of the total content of the components (A) to (C). When the content of the component (C) is 5 parts by mass or more relative to 100 parts by mass of the total content of the components (A) to (C), there is a tendency that the dielectric characteristics and the hygroscopicity resistance become more favorable, whereas when it is 60 parts by mass or less, there is a tendency that the heat resistance, the moldability, the processability, and the flame retardancy become more favorable.

The content ratio of the component (A) to the component (B) [(A)/(B)] is, though not specifically limited thereto but from the viewpoint of compatibility with other resin, dielectric characteristics, low thermal expansion, and heat resistance, preferably more than 1.0, more preferably 1.5 to 5.0, even more preferably 1.8 to 4.5, further more preferably 2.0 to 4.0, especially more preferably 2.2 to 3.5 and is most preferably 2.5 to 3.2 on a mass basis. When the content ratio [(A)/(B)] is more than 1.0, there is a tendency that the resultant resin composition can have excellent dielectric characteristics in a high-frequency band of 10 GHz or higher, and when 5.0 or less, there is a tendency that it can have excellent heat resistance, moldability and processability.

<Other Components>

The resin composition of the present embodiment may be one further including other components.

Examples of the other components include one or more selected from the group consisting of an inorganic filler (D) [hereinafter occasionally abbreviated as a component (D)], a flame retardant (E) [hereinafter occasionally abbreviated as a component (E)], and a curing accelerator (F) [hereinafter occasionally abbreviated as a component (F)]. By incorporating such a component, various characteristics on the occasion of fabricating into a laminated board can be more improved.

However, the resin composition of the present embodiment may not contain one or more selected from the group consisting of the component (D), the component (E), and the component (F) according to the desired performance.

These components are hereunder described in detail.

(Inorganic Filler (D))

By incorporating the inorganic filler (D) into the resin composition of the present embodiment, there is a tendency that the thermal expansion coefficient, the elastic modulus, the heat resistance, and the flame retardancy can be improved.

Although the component (D) is not particularly limited, examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay (e.g., calcined clay), talc, aluminum borate, and silicon carbide. The component (D) may be used alone or may be used in combination of two or more thereof. Of these, from the viewpoint of thermal expansion coefficient, elastic modulus, heat resistance, and flame retardancy, silica, alumina, mica, and talc are preferred, silica and alumina are more preferred, and silica is still more preferred.

Examples of the silica include a precipitated silica which is produced by a wet method and has a high water content; and a dry silica which is produced by a dry method and contains little bound water or the like. Examples of the dry silica include crushed silica, fumed silica, and molten silica (molten spherical silica) depending on the production method.

Although the shape and the particle diameter of the inorganic filler (D) are not particularly limited, for example, the particle diameter is preferably 0.01 to 20 µm, more preferably 0.1 to 10 µm, still more preferably 0.2 to 1 µm, and especially preferably 0.3 to 0.8 µm. Here, the particle diameter refers to an average particle diameter and is a particle diameter of a point corresponding to a volume of 50% in a cumulative frequency distribution curve that is determined by particle diameters with the whole volume of particles taken as 100%. The particle diameter of the inorganic filler (D) can be measured by a particle size distribution measurement apparatus using a laser diffraction scattering method or the like.

In the case where the resin composition of the present embodiment contains the component (D), though the content of the component (D) in the resin composition is not particularly limited, it is preferably 5 to 70% by mass, more preferably 15 to 65% by mass, still more preferably 20 to 60% by mass, especially preferably 30 to 55% by mass, and most preferably 40 to 50% by mass relative to the total solid content of the resin composition from the viewpoint of thermal expansion coefficient, elastic modulus, heat resistance, and flame retardancy.

In the case of using the component (D), for the purpose of improving the dispersibility of the component (D) and adhesion of the component (D) to an organic component in the resin composition, a coupling agent may be jointly used, as required. The coupling agent is not particularly limited, and for example, a silane coupling agent or a titanate coupling agent can be appropriately selected and used. The coupling agent may be used alone or may be used in combination of two or more thereof. In addition, a use amount of the coupling agent is not particularly limited.

In the case of using the coupling agent, the treatment method may be a so-called integral blend treatment method in which the component (D) is blended in the resin composition, and then, the coupling agent is added, but is preferably a method in which an inorganic filler previously surface-treated with a coupling agent by a dry or wet method is used. By adopting this method, the advantages of the component (D) can be more effectively exhibited.

In the present embodiment, in the case of using the component (D), for the purpose of improving the dispersibility of the component (D) into the resin composition, the component (D) can be used in the form of a slurry in which the component (D) is previously dispersed in an organic solvent, as required. Although the organic solvent which is used on the occasion of forming the component (D) into a slurry is not particularly limited, for example, the organic solvents exemplified in the production step of the component (A1) as mentioned above can be applied.

(Flame Retardant (E))

By including the flame retardant (E) in the resin composition of the present embodiment, there is a tendency that the flame retardancy of the resin composition can be improved.

Examples of the component (E) include a phosphorus-based flame retardant, a metal hydrate, and a halogen-based flame retardant. From the viewpoint of environmental issue, the component (E) may be a phosphorus-based flame retardant and a metal hydrate. The component (E) may be used alone or may be used in combination of two or more thereof. A flame retardant auxiliary may be further included, as required.

—Phosphorus-Based Flame Retardant—

The phosphorus-based flame retardant is not particularly limited so long as it is one containing a phosphorus atom among usual flame retardants, and it may be an inorganic phosphorus-based flame retardant or may be an organic phosphorus-based flame retardant. The phosphorus-based flame retardant is preferably one not containing a halogen atom from the viewpoint of environmental issue. The phosphorus-based flame retardant may be an organic phosphorus-based flame retardant from the viewpoint of dielectric characteristics, adhesiveness to a conductor, heat resistance, glass transition temperature, thermal expansion coefficient, and flame retardancy.

Examples of the inorganic phosphorus-based flame retardant include red phosphorus; an ammonium phosphate, such as monoammonium phosphate, diammonium phosphate, triammonium phosphate, and ammonium polyphosphate; an inorganic nitrogen-containing phosphorus compound, such as phosphoric amide; phosphoric acid; and phosphine oxide.

Examples of the organic phosphorus-based flame retardant include an aromatic phosphoric acid ester, a phosphonic acid diester, a phosphinic acid ester, a phosphinic acid metal salt, an organic nitrogen-containing phosphorus compound, and a cyclic organic phosphorus compound. Of these, an aromatic phosphoric acid ester compound and a phosphinic acid metal salt are preferred. Here, the metal salt may be, for example, any of a lithium salt, a sodium salt, a potassium salt, a calcium salt, a magnesium salt, an aluminum salt, a titanium salt, and a zinc salt, or may be an ammonium salt. In addition, among the organic phosphorus-based flame retardants, an aromatic phosphoric acid ester is preferred.

Examples of the aromatic phosphoric acid ester include triphenyl phosphate, tricresyl phosphate, trixylenyl phosphate, cresyl diphenyl phosphate, cresyl-2,6-xylenyl phosphate, resorcinol bis(diphenyl phosphate), 1,3-phenylenebis (di-2,6-xylenyl phosphate), bisphenol A-bis(diphenyl phosphate), and 1,3-phenylene bis(diphenyl phosphate).

Examples of the phosphonic acid diester include divinyl phenylphosphonate, diallyl phenylphosphonate, and bis(1-butenyl)phenylphosphonate.

Examples of the phosphinic acid ester include phenyl diphenylphosphinate and methyl diphenylphosphinate.

Examples of the phosphinic acid metal salt include a dialkylphosphinic acid metal salt, a diallylphosphinic acid metal salt, a divinylphosphinic acid metal salt, and a diarylphosphinic acid metal salt. Such a metal salt may be any of a lithium salt, a sodium salt, a potassium salt, a calcium salt, a magnesium salt, an aluminum salt, a titanium salt, and a zinc salt, or may be an aluminum salt.

Examples of the organic nitrogen-containing phosphorus compound include a phosphazene compound, such as bis (2-allylphenoxy)phosphazene and dicresylphosphazene; melamine phosphate; melamine pyrophosphate; melamine polyphosphate; and melam polyphosphate.

Examples of the cyclic organic phosphorus compound include 9,10-dihydro-9-oxa-10-phosphaphenanthrene-10-oxide and 10-(2,5-dihydroxyphenyl)-9,10-dihydro-9-oxa-10-phosphaphenanthrene-10-oxide.

Of these, an aromatic phosphoric acid ester and a phosphinic acid metal salt are preferred, an aromatic phosphoric acid ester and a dialkylphosphinic acid metal salt are more preferred, and 1,3-phenylenebis(di-2,6-xylenyl phosphate) and a tris(dialkylphosphinic acid) aluminum salt are even more preferred.

—Metal Hydrate—

Examples of the metal hydrate include an aluminum hydroxide hydrate and a magnesium hydroxide hydrate. These may be used alone or may be used in combination of two or more thereof. Although the metal hydroxide may also be corresponding to the inorganic filler, in the case of a material capable of imparting flame retardancy, it is classified into the flame retardant.

—Halogen-Based Flame Retardant—

The halogen-based flame retardant includes a chlorine-based flame retardant and a bromine-based flame retardant. The chlorine-based flame retardant include a chlorinated paraffin.

In the case where the resin composition of the present embodiment contains the component (E), when a phosphorus-based flame retardant is used as the component (E), though the content of the phosphorus-based flame retardant in the resin composition is not particularly limited, for example, it is preferably 0.2 to 20 parts by mass, more preferably 0.5 to 15 parts by mass, and still more preferably 0.5 to 5 parts by mass relative to 100 parts by mass of the total sum of the resin component in the resin composition. When the content of the component (E) as expressed in terms of a phosphorus atom is 0.2 parts by mass or more relative to 100 parts by mass of the sum total of the resin composition, there is a tendency that more favorable flame retardancy is obtained, whereas when it is 20 parts by mass or less, there is a tendency that more favorable moldability and high adhesiveness to a conductor, excellent heat resistance, and high glass transition temperature are obtained.

(Curing Accelerator (F))

By including the curing accelerator (F) in the resin composition of the present embodiment, there is a tendency that the curability of the resin composition is improved, and dielectric characteristics, heat resistance, adhesiveness to a conductor, elastic modulus, and glass transition temperature can be improved.

Examples of the component (F) include an acidic catalyst, such as p-toluenesulfonic acid; an amine compound, such as triethylamine, pyridine, and tributylamine; an imidazole compound, such as methylimidazole, phenylimidazole, and an isocyanate mask imidazole (for example, an addition reaction product between a hexamethylenediisocyanate resin, 2-ethyl-4-methylimidazole and the like); a tertiary amine compound; a quaternary ammonium compound; a phosphorus-based compound, such as triphenyl phosphine; an organic peroxide, such as dicumyl peroxide, 2,5-dimethyl-2,5-bis(t-butylperoxy)hexine-3,2,5-dimethyl-2,54-butylperoxykexane, t-butylperoxyisopropyl monocarbonate, and α,α'-bis(t-butylperoxy) diisopropylbenzene; and a carboxylic acid salt of manganese, cobalt, zinc, etc. These may be used alone or may be used in combination of two or more thereof. Of these, from the viewpoint of heat resistance, glass transition temperature, and storage stability, the component (F) may be an imidazole compound, an organic peroxide, or a carboxylic acid salt; and from the viewpoint of heat resistance, glass transition temperature, elastic modulus, and thermal expansion coefficient, an imidazole compound may be used in combination with an organic peroxide or a carboxylic acid salt. In addition, among the organic peroxides, α,α'-bis(t-butylperoxy) diisopropylbenzene may be selected, and among the carboxylic acid salts, manganese naphthenate may be selected.

In the case where the resin composition of the present embodiment contains the component (F), though the content of the component (F) is not particularly limited, for example, it is preferably 0.01 to 10 parts by mass, more preferably 0.05 to 8 parts by mass, still more preferably 0.1 to 5 parts by mass, and especially preferably 0.2 to 2 parts by mass relative to 100 parts by mass of the total sum of the resin component in the resin composition. When the content of the component (F) falls within the aforementioned range, there is a tendency that more favorable heat resistance and storage stability are obtained.

In the resin composition of the present embodiment, a resin material, such as other thermoplastic resin and elastomer than the aforementioned respective resins, as well as an antioxidant, a thermal stabilizer, an antistatic agent, a UV absorbent, a pigment, a colorant, a lubricant, and the like can be appropriately selected and included, as required. These may be used alone or may be used in combination of two or more thereof. In addition, a use amount thereof is not particularly limited, and such a material may be used within a range where the effects of the present embodiment are not impaired.

(Organic Solvent)

From the viewpoint of facilitating the handling through dilution as well as the viewpoint of facilitating the production of a prepreg as mentioned later, the resin composition of the present embodiment may contain an organic solvent. In general, the resin composition having an organic solvent contained therein is occasionally referred to as "resin varnish" or "varnish".

Although the organic solvent is not particularly limited, examples thereof include an alcohol-based solvent, such as ethanol, propanol, butanol, methyl cellosolve, butyl cellosolve, and propylene glycol monomethyl ether; a ketone-based solvent, such as acetone, methyl ethyl ketone, methyl isobutyl ketone, and cyclohexanone; an ether-based solvent, such as tetrahydrofuran; an aromatic solvent, such as toluene, xylene, and mesitylene; a nitrogen atom-containing solvent, such as dimethylformamide, dimethylacetamide, and N-methylpyrrolidone; a sulfur atom-containing solvent, such as dimethyl sulfoxide; and an ester-based solvent, such as γ-butyrolactone.

Of these, from the viewpoint of solubility, an alcohol-based solvent, a ketone-based solvent, and a nitrogen atom-containing solvent are preferred; a ketone-based solvent is more preferred; acetone, methyl ethyl ketone, methyl isobutyl ketone, and cyclohexanone are still more preferred; and methyl ethyl ketone is especially preferred.

The organic solvent may be used alone or may be used in combination of two or more thereof.

In the case where the resin composition of the present embodiment contains an organic solvent, the concentration of the solid components thereof is, for example, 30 to 90% by mass, may be 35 to 80% by mass, or may be 40 to 60% by mass. By using a resin composition in which the concentration of the solid components falls within the aforementioned range, there is a tendency that the handleability becomes easy, the impregnation properties into a substrate and the appearance of a produced prepreg are favorable, the control of the concentration of the solid components of the resin in a prepreg as mentioned later becomes easy, and the production of a prepreg having a desired thickness becomes easy.

The resin composition of the present embodiment can be produced by mixing the component (A), the component (B) and the component C), and if desired, other components to be jointly used by a known method. On that occasion, the respective components may be dissolved or dispersed while stirring. Conditions, such as order of mixing, temperature, time, and the like are not particularly limited and can be appropriately set according to the types of the raw materials and so on.

The resin composition of the present embodiment is favorable in compatibility, and there is a tendency that even if allowing to stand for one day, no deposit is produced. In addition, in an embodiment with more favorable compatibility, there is a tendency that even if allowing to stand for one week, no deposit is produced (however, phase separation occasionally occurs); and in an embodiment with still more favorable compatibility, there is a tendency that even if allowing to stand for one week, even phase separation does not occur.

A dielectric constant (Dk) at 10 GHz of a cured product of the resin composition of the present embodiment (a laminate not including a fiber substrate, such as a glass cloth, and a cured product of a resin film) is preferably 3.0 or less, more preferably 2.9 or less, and still more preferably 2.8 or less. The dielectric constant (Dk) is preferably smaller, and a lower limit value thereof is not particularly restricted; however, taking into consideration a balance with other physical properties, for example, it may be 2.4 or more, or may be 2.5 or more.

A dielectric dissipation factor (Df) at 10 GHz of a cured product of the resin composition of the present embodiment (a laminate not including a fiber substrate, such as a glass cloth, and a cured product of a resin film) is preferably 0.0030 or less, more preferably 0.0025 or less, still more preferably 0.0023 or less, especially preferably 0.0022 or less, and most preferably 0.0020 or less. The dielectric dissipation factor (Df) is preferably smaller, and a lower limit value thereof is not particularly restricted; however, taking into consideration a balance with other physical properties, for example, it may be 0.0010 or more, or may be 0.0015 or more.

It is to be noted that the dielectric constant (Dk) and the dielectric dissipation factor (Df) are values according to a cavity resonator perturbation method, and in more detail, are values measured by a method described in Examples. In addition, in this description, when the dielectric constant is simply referred to herein, it means a relative permittivity.

[Production Method for Maleimide Resin Composition]

The production method for the maleimide resin composition of the present embodiment is a method for producing the maleimide resin composition of the present embodiment including the following steps 1 and 2:

Step 1: a step of reacting (b1) a conjugated diene polymer having a vinyl group in the side chain and (b2) a maleimide compound having two or more N-substituted maleimide groups to obtain (B) a modified conjugated diene polymer; and Step 2: a step of mixing (A) one or more selected from the group consisting of a maleimide compound having one or more N-substituted maleimide groups and a derivative thereof, (B) the modified conjugated diene polymer and (C) a thermoplastic elastomer other than the component (B).

Suitable conditions of the reaction in the step 1 are those described in the explanation regarding the component (B).

The mixing in the step 2 may be performed using a known stirrer or the like, and for example, it is preferred to put the component (A), the component (B) and the component (C) into the aforementioned organic solvent and stirring for mixing the contents at room temperature or under heating. A heating temperature on the occasion of mixing is, for example, 30 to 100° C., and preferably 40 to 90° C.

A concentration of the component (A), the component (B) and the component (C) in the mixed liquid at the time of mixing is the same as the suitable range of the concentration of the solid components of the resin composition in the case where the resin composition of the present embodiment contains the organic solvent.

[Prepreg]

The prepreg of the present embodiment is a prepreg containing the maleimide resin composition of the present embodiment or a semi-cured product of the maleimide resin composition.

The prepreg of the present embodiment is, for example, one including the resin composition of the present embodiment or a semi-cured product of the resin composition, and a sheet-shaped fiber substrate. The prepreg is formed using the resin composition of the present embodiment and a sheet-shaped fiber substrate, and for example, it can be obtained by impregnating or coating the sheet fiber substrate with the resin composition of the present embodiment, followed by drying optionally into a semi-cured condition (B-staged condition). More specifically, for example, the prepreg of the present embodiment can be produced by heating for drying in a drying furnace typically at a temperature of 80 to 200° C. for 1 to 30 minutes to semi-cure (convert into B-stage) the resin composition. Here in the present description, converting into B-stage means that the prepreg is made to be in a B-staged condition as defined in JIS K6900(1944).

A use amount of the resin composition can be appropriately determined such that the concentration of the solid components derived from the resin composition in the prepreg after drying is 30 to 90% by mass. By allowing the concentration of the solid components to fall within the aforementioned range, there is a tendency that on the occasion of forming into a laminated board, more favorable moldability is obtained.

As the sheet-shaped fiber substrate of the prepreg, a known substrate used in various laminated boards for electrical insulating materials is used. The sheet-shaped fiber substrate is not specifically limited but is, for example, preferably a sheet-shaped fiber-reinforced substrate for use for the purpose of reinforcing the prepreg. The material of the sheet-shaped fiber substrate includes an inorganic fiber, such as E-glass, D-glass, S-glass, and Q-glass; an organic fiber, such as a polyimide, a polyester, and tetrafluoroethylene; and a mixture thereof. Such a sheet-shaped fiber substrate has a shape of, for example, woven fabric, nonwoven fabric, roving, chopped strand mat, surfacing mat, or the like.

Although a thickness of the sheet-shaped fiber substrate is not particularly limited, for example, a substrate of 0.02 to 0.5 mm can be used.

From the viewpoint of impregnation properties with the resin composition as well as heat resistance, hygroscopicity resistance, and processability when formed into a laminated board, a substrate surface-treated with a coupling agent or the like and a substrate mechanically treated for fiber opening can be used as the sheet-shaped fiber substrate.

As a method for impregnating or coating the sheet-shaped fiber substrate with the resin composition, the following hot melt method or solvent method can be adopted.

The hot melt method is (1) a method in which a coating paper with good releasability from the resin composition is once coated with the resin composition and then laminated on the sheet-shaped fiber substrate, or (2) a method in which the sheet-shaped fiber substrate is coated with the resin composition by a die coater, without including an organic solvent in the resin composition.

On the other hand, the solvent method is a method in which an organic solvent is included in the resin composition, and the sheet-shaped fiber substrate is immersed in the resulting resin composition to impregnate the sheet-shaped fiber substrate with the resin composition, followed by drying.

[Resin Film]

The resin film of the present embodiment is a resin film containing the resin composition of the present embodiment or a semi-cured product of the resin composition.

The resin film of the present embodiment can be, for example, produced by coating the resin composition containing an organic solvent, namely the resin varnish on a support, followed by heating for drying optionally into a semi-cured condition (B-staged condition).

Examples of the support include a film of a polyolefin, such as polyethylene, polypropylene, and polyvinyl chloride; a film of a polyester, such as polyethylene terephthalate (hereinafter also referred to as "PET") and polyethylene naphthalate; and various plastic films, such as a polycarbonate film and a polyimide film. In addition, as the support, a metal foil, such as a copper foil and an aluminum foil, a release paper, and the like may be used. The support may be one having been subjected to a surface treatment, such as a matting treatment and a corona discharge treatment. In addition, the support may be one having been subjected to a release treatment with a silicone resin-based release agent, an alkyd resin-based release agent, a fluorine resin-based release agent, etc.

Although a thickness of the support is not particularly limited, it is preferably 10 to 150 μm, and more preferably 25 to 50 μm.

The method for coating the resin varnish on the support is not particularly limited, and a coating apparatus which is known by those skilled in the art, such as a comma coater, a bar coater, a kiss coater, a roll coater, a gravure coater, and a die coater, can be used. Such a coating apparatus may be appropriately selected according to the film thickness.

Although a drying temperature and a drying time may be appropriately determined according to the use amount of the organic solvent, the boiling point of the used organic solvent, and the like, for example, in the case of a resin varnish containing about 40 to 60% by mass of the organic solvent, the resin film can be suitably formed by drying at 50 to 150° C. for about 3 to 10 minutes.

[Laminated Board]

The laminated board of the present embodiment is a laminated board including a cured product of the resin composition of the present embodiment or a cured product of the prepreg, and a metal foil.

The laminated board of the present embodiment can be, for example, obtained by placing a metal foil on one face or both faces of one prepreg of the present embodiment or placing a metal foil on one face or both faces of a stack of two or more prepregs of the present embodiment, and then molding the resultant with heat and pressure. In the laminated board produced according to the production method, the prepreg of the present embodiment is converted into a C-stage. In the present description, converting into a C-stage means that the prepreg is made to be in a C-staged condition as defined in JIS K6900(1994). The laminated board including a metal foil is occasionally referred to as "metal-clad laminated board".

Though not specifically limited thereto but from the viewpoint of electroconductivity, the metal for the metal foil can be copper, gold, silver, nickel, platinum, molybdenum, ruthenium, aluminum, tungsten, iron, titanium, chromium, or an alloy containing one or more of these metal elements. Copper and aluminum are preferred, and copper is more preferred.

Although the conditions for molding with heat and pressure are not particularly limited, the molding can be, for example, carried out in a range where the temperature is 100 to 300° C., the pressure is 0.2 to 10 MPa, and the time is 0.1 to 5 hours. In addition, for the molding with heat and pressure, a method in which a vacuum state can be kept for 0.5 to 5 hours by using a vacuum pump or the like can be adopted.

[Printed Wiring Board]

The printed wiring board of the present embodiment is one containing one or more selected from the group consisting of a cured product of the resin composition of the present embodiment, a cured product of the prepreg of the present embodiment, and the laminated board of the present embodiment. The printed wiring board of the present embodiment can be produced using one or more selected from the group consisting of the prepreg of the present embodiment, the resin film of the present embodiment, and the laminated board of the present embodiment, through circuit formation processing by drilling, metal plating, metal foil etching or the like. Further as needed, the printed wiring board can be processed for multilayer adhesion to produce a multilayer printed wiring board. In the printed wiring board of the present embodiment the prepreg of the present embodiment and the resin film of the present embodiment is in a C-staged condition.

[Semiconductor Package]

The semiconductor package of the present embodiment is one containing the printed wiring board and a semiconductor device. The semiconductor package of the present embodiment can be produced by mounting a semiconductor device such as a semiconductor chip or a memory on a predetermined position on the printed wiring board of the present embodiment.

The resin composition, the prepreg, the resin film, the laminated board, the printed wiring board and the semiconductor package of the present embodiment can be used favorably for electronic devices handling high-frequency signals of 10 GHz or higher. In particular, the printed wiring board is useful as a printed wiring board for millimeter wave radar.

Preferred embodiments are described hereinabove, but these are exemplification for explaining the present embodiment, and these is not intended to limit the scope of the present invention to these embodiments. The present embodiment can be implemented in various aspects different from the above-mentioned embodiments without departing from the gist of the present invention.

EXAMPLES

The present embodiment is hereunder specifically described by reference to Examples, but it should be construed that the present embodiment is not limited to the following Examples.

It is to be noted that, in each of the Examples, the number average molecular weight was measured by the following procedure.

(Measurement Method of Number Average Molecular Weight)

The number average molecular weight was calculated based on a calibration curve obtained using standard polystyrene by gel permeation chromatography (GPC). The calibration curve was obtained using standard polystyrene: TSK standard POLYSTYRENE (Type; A-2500, A-5000, F-1, F-2, F-4, F-10, F-20, F-40) [manufactured by Tosoh Corporation, trade names] with a cubic approximation. The measurement conditions of GPC are shown below.

Apparatus: High-performance GPC apparatus HLC-8320 GPC

Detector: Ultraviolet absorption detector UV-8320 [manufactured by Tosoh Corporation]

Column: Guard column; "TSK Guard column SuperHZ-L"+column; "TSKgel SuperHZM-N+TSKgel SuperHZM-M"+"TSKgel SuperH-RC" (all manufactured by Tosoh Corporation, tradenames)

Column size: 4.6×20 mm (guard column), 4.6×150 mm (column), 6.0×150 mm (reference column)

Eluent: Tetrahydrofuran

Sample concentration: 10 mg/5 mL

Injection: 25 μL

Flow rate: 1.00 mL/min

Measurement temperature: 40° C.

(Measurement of Vinyl Group Modification Ratio)

A value determined according to the following method is referred to as the vinyl group modification ratio of the conjugated diene polymer (B1).

A solution containing the component (b1) and the component (b2) before commencement of the reaction and a solution containing the modified conjugated diene polymer (B1) obtained after the reaction were analyzed for GPC according to the same method as above. A reduction ratio of a peak area derived from the component (b2) before and after the reaction, namely [{(peak area derived from the component (b2) before the reaction)−(peak area derived from the component (b2) after the reaction)×100}/(peak area derived from the component (b2) before the reaction)] was calculated, and the resultant value is referred to as the vinyl group modification ratio.

[Production of Modified Conjugated Diene Polymer]

Production Examples 1 to 5

Into a glass-made flask vessel of a 2 L volume which was equipped with a thermometer, a reflux condenser, and a stirrer and was able to be heated and cooled, the component (b1) and the component (b2) in amounts shown in Table 1 and as an organic peroxide and an organic solvent, toluene were put and allowed to react in a nitrogen atmosphere while stirring at 90 to 100° C. for 5 hours. There were obtained solutions containing modified conjugated diene polymers B-1 to B-5 (toluene diluent, concentration of solid components: 35% by mass).

The vinyl group modification ratio and the number average molecular weight of each of the resultant modified conjugated diene polymers are shown in Table 1.

TABLE 1

|  |  |  | Production Example 1 | Production Example 2 | Production Example 3 | Production Example 4 | Production Example 5 |
|---|---|---|---|---|---|---|---|
|  | Kind of Modified Conjugated Diene Polymer |  | B-1 | B-2 | B-3 | B-4 | B-5 |
| (b1) | polybutadiene 1 | mass part | 33.8 | 33.1 | — | — | — |
|  | polybutadiene 2 | mass part | — | — | 33.8 | 33.5 | — |
|  | polybutadiene 3 | mass part | — | — | — | — | 33.5 |
| (b2) | bismaleimide compound 1 | mass part | 1.21 | — | 1.21 | — | — |
|  | bismaleimide compound 2 | mass part | — | 1.89 | — | — | — |
|  | bismaleimide compound 3 | mass part | — | — | — | 1.48 | 1.48 |
| Reaction Catalyst | organic peroxide | mass part | 0.035 | 0.035 | 0.035 | 0.035 | 0.035 |
| Physical Properties | vinyl group modification ratio | % | 40 | 50 | 60 | 70 | 40 |
|  | number-average molecular weight | — | 1,900 | 2,000 | 2,100 | 2,150 | 1,900 |

Details of the respective components described in Table 1 are as follows.

[Component (b1)]

Polybutadiene 1: 1,2-Polybutadiene homopolymer, number average molecular weight=3,200, vinyl group content=90% or more Polybutadiene 2: 1,2-Polybutadiene homopolymer, number average molecular weight=2,100, vinyl group content=90% or more Polybutadiene 3: 1,2-Polybutadiene homopolymer, number average molecular weight=1,200, vinyl group content=85% or more

[Component (b2)]

Bismaleimide compound 1: 4,4'-Diphenylmethanebismaleimide

Bismaleimide compound 2: 2,2-bis[4-(4-maleimidophenoxy)phenyl]propane

Bismaleimide compound 3: 3,3'-Dimethyl-5,5'-diethyl-4,4'-diphenylmethanebismaleimide

[Reaction Catalyst]

Organic peroxide: α,α'-bis(t-butylperoxy)diisopropylbenzene

Examples 1 to 6 and Comparative Examples 1 to 3

(Preparation of Resin Composition)

The respective components described in Table 2 were stirred and mixed at room temperature or while heating at 50 to 80° C. together with a predetermined amount of a curing accelerator in blending amounts (unit: parts by mass) described in Table 2 with optionally adding thereto methyl ethyl ketone to prepare resin compositions having a concentration of solid components (non-volatile components) of about 50% by mass.

(Production of double-side copper foil-attached resin plate)

The resin composition obtained in each of the Examples was coated on a 38 μm-thick PET film (manufactured by Teijin Limited, a trade name: G2-38) and then heated for drying at 170° C. for 5 minutes, to fabricate a resin film in the B-stage condition. This resin film was exfoliated from the PET film and then pulverized to form a resin powder. Subsequently, the resin powder was put on a TEFLON (registered trademark) sheet having been punched out in a size of 1 mm in thickness×50 mm in length×35 mm in width; a low profile copper foil having a thickness of 18 μm (manufactured by Mitsui Mining & Smelting Co., Ltd., a trade name: 3EC-VLP-18) was placed on the upper and lower faces thereof such that the M surface was in contact with the resin powder as put thereon. Subsequently, this was molded under heat and pressure under conditions of a temperature of 230° C., a pressure of 2.0 MPa, and a time of 120 minutes to cure the resin composition, thereby fabricating a double-side copper foil-attached resin plate (thickness of resin plate: 1 mm).

[Measurement or Evaluation Method]

The resin compositions and the double-side copper foil-attached resin plates obtained in the aforementioned Examples and Comparative Examples were measured and evaluated according to the following methods. The results are shown in Table 2.

(1. Evaluation Method for Compatibility of Resin Composition)

The resin composition obtained in each of the Examples was visually observed and evaluated for compatibility (presence or absence of macroscopic phase separation and deposit) according to the following criteria. A is the best, B is acceptable, and C is not good.

A: Even when allowing to stand for one week or more, neither macroscopic phase separation nor deposit was produced.
B: Even when allowing to stand for one day, no change was found. However, when allowing to stand for 3 days or more, though no deposit was produced, macroscopic phase separation was slightly produced.
C: When allowing to stand for one day, a deposit and macroscopic phase separation were produced.

(2. Evaluation Method for Dielectric Characteristics (Dielectric Constant and Dielectric Dissipation Factor))

From an evaluation substrate prepared by immersing the double-side copper foil-attached resin plate obtained in each of the Examples in a 10% by mass solution of ammonium persulfate (manufactured by Mitsubishi Gas Chemical Company, Inc.) that is a copper etching solution to remove the copper foil, an evaluation substrate of 2 mm×50 mm was fabricated.

In conformity with a cavity resonator perturbation method, the evaluation substrate was measured for dielectric constant (Dk) and dielectric dissipation factor (DO in a 10 GHZ band at an ambient temperature 25° C.

(3. Measurement Method for Thermal Expansion Coefficient)

A 5-mm square test piece was prepared by etching the copper foil on both faces of the double-side copper foil-attached resin plate obtained in each Example, and measured for the thermal expansion coefficient (plate thickness direction, temperature range: 30 to 120° C.), using a thermomechanical measuring apparatus (TMA) [manufactured by TA Instruments Japan Inc., Q400 (model number)] in conformity with the IPC (The Institute for Interconnecting and Packaging Electronic Circuits) Standards.

(4. Measurement Method for Peel Strength)

The peel strength was measured using "EZ-Test/CE" by Shimadzu Corporation and according to the following method. A test piece was prepared by etching a copper foil on both faces of the double-side copper foil-attached resin plate obtained in each Example to be a 5-mm wide linear line followed by drying it under the condition of 105° C./1 hr. From the test piece, the copper foil was peeled in the direction of 90° according to JIS C6481 to measure the peel strength. The pulling rate was 50 mm/min.

(5. Heat Resistance Valuation Method)

From the double-side copper foil-attached resin plate obtained in each Example, the copper foils were removed by etching to give a test piece (40 mm×mm). Using a pressure cooker "HA-300M" (by Hirayama Manufacturing Corporation), the test piece was processed for a predetermined period of time under the condition of 121° C. and 0.11 MPa, and then immersed in a molten solder at 288° C. for 20 seconds. Subsequently, the test piece was observed visually and checked for the presence of absence of blister, and evaluated according to the following criteria.

A: No blister found.
C: Blister found.

TABLE 2

|  |  | Example | | | | | | Comparative Example | | |
|---|---|---|---|---|---|---|---|---|---|---|
|  |  | 1 | 2 | 3 | 4 | 5 | 6 | 1 | 2 | 3 |
| (A) | bismaleimide compound A-1 | 22.5 | — | 22.5 | — | — | — | 22.5 | — | 38.8 |
|  | bismaleimide compound A-2 | — | 22.5 | — | — | — | — | — | — | — |
|  | bismaleimide compound A-3 | — | — | — | 22.5 | — | 5 | — | — | — |
|  | polymaleimide compound A-4 | — | — | — | — | 22.5 | 17.5 | — | — | — |
| (B) | modified conjugated diene polymer B-1 | 7.8 | — | — | — | — | — | — | — | — |
|  | modified conjugated diene polymer B-2 | — | 7.8 | — | — | — | — | — | — | — |
|  | modified conjugated diene polymer B-3 | — | — | 7.8 | — | — | — | — | — | — |

TABLE 2-continued

| | | | Example | | | | | | Comparative Example | | |
|---|---|---|---|---|---|---|---|---|---|---|---|
| | | | 1 | 2 | 3 | 4 | 5 | 6 | 1 | 2 | 3 |
| | | modified conjugated diene polymer B-4 | — | — | — | 7.8 | — | — | — | — | — |
| | | modified conjugated diene polymer B-5 | — | — | — | — | 7.8 | 7.8 | — | — | — |
| | (B') | conjugated diene polymer | — | — | — | — | — | — | 7.8 | 19 | 7.8 |
| | (C) | thermoplastic elastomer C-1 | 16.3 | 16.3 | 16.3 | 16.3 | 16.3 | — | 16.3 | 27.6 | — |
| | | thermoplastic elastomer C-2 | — | — | — | — | — | 16.5 | — | — | — |
| | (D) | spherical silica | 47.5 | 47.5 | 47.5 | 47.5 | 47.5 | 47.5 | 47.5 | 47.5 | 47.5 |
| | (E) | aluminum tridiethlphosphinate*[1] | 5.9 (1) | 5.9 (1) | 5.9 (1) | 5.9 (1) | 5.9 (1) | 5.9 (1) | 5.9 (1) | 5.9 (1) | 5.9 (1) |
| | (F) | organic peroxide | 0.5 | 0.5 | 0.5 | 0.5 | 0.5 | 0.5 | 0.5 | 0.5 | 0.5 |
| Measurement or Evaluation Results | 1. compatibility | | B | B | B | B | A | A | C | A | A |
| | 2. dielectric characteristics | dielectric constant (Dk) (10 GHz) | 2.8 | 2.8 | 2.8 | 2.8 | 2.8 | 2.8 | | 2.7 | 2.9 |
| | | dielectric dissipation factor (Df) (10 GHz) | 0.0023 | 0.0022 | 0.0023 | 0.0021 | 0.0020 | 0.0020 | | 0.0018 | 0.0060 |
| | 3. thermal expansion coefficient (ppm/° C.) | | 60 | 60 | 60 | 60 | 65 | 63 | | 90 | 50 |
| | 4. peel strength (kN/m) | | 0.6 | 0.6 | 0.6 | 0.6 | 0.6 | 0.6 | | 0.3 | 0.5 |
| | 5. heat resistance | | A | A | A | A | A | A | | C | A |

*[1]Numeral in parenthesis indicates phosphorus atom-equivalent amount.

The materials in Table 2 are as follows
[Component (A)]
  Bismaleimide compound A-1: bis(4-maleimidophenyl)methane
  Bismaleimide compound A-2: 2,2-bis[4-(4-maleimidophenoxy)phenyl]propane
  Bismaleimide compound A-3: 3,3'-dimethyl-5,5'-diethyl-4,4'-diphenylmethanebismaleimide
  Polymaleimide compound A-4: biphenylaralkyl-type maleimide (MIR-3000, by Nippon Kayaku Co., Ltd.)
[Component (B)]
  Modified conjugated diene polymers B-1 to B-5: modified conjugated diene polymers produced in Production Examples 1 to 5 were used.
[Component (B')]
  1,2-Polybutadiene homopolymer (unmodified), number average molecular weight=3,200, vinyl group content=90% or more
[Component (C)]
  Thermoplastic elastomer C-1: styrene-ethylene-butylene-styrene copolymer (SEBS), styrene content 42% by mass, Mw=75,000
  Thermoplastic elastomer C-2: styrene-ethylene-butylene-styrene copolymer (SEBS), styrene content 30% by mass, Mw=86,000
[Component (D)]
  Spherical silica: average particle size 0.5 μm
[Component (E)]
  Aluminum tris(diethylphosphinate)
[Component (F)]
  Organic peroxide: dicumyl peroxide As obvious from the results shown in Table 2, the maleimide resin compositions obtained in Examples 1 to 6 of the present embodiment have good compatibility and are therefore excellent in handleability. In addition, the cured products produced using the maleimide resin compositions of Examples 1 to 6 of the present embodiment are excellent in heat resistance, low thermal expansion and peel strength, and excellent in dielectric characteristics in a high-frequency band of 10 GHz.

On the other hand, the maleimide resin composition obtained in Comparative Example 1 has poor compatibility and is not good in handleability. Comparative Example 2 is good in compatibility but is inferior in heat resistance. Comparative Example 3 is insufficient in point of dielectric characteristics in a high-frequency band of 10 GHz.

INDUSTRIAL APPLICABILITY

The maleimide resin composition of the present embodiment is favorable in compatibility, and the laminated board fabricated from the maleimide resin composition is excellent especially in dielectric characteristics in a high-frequency band of 10 GHz or higher, and therefore, it is useful as a printed wiring board to be utilized for a fifth generation mobile communication system (5G) antenna that uses radio waves in the frequency band of over 6 GHz and a millimeter wave radar that uses radio waves in the frequency band of 30 to 300 GHz.

The invention claimed is:
1. A maleimide resin composition comprising:
  (A) one or more selected from the group consisting of a maleimide compound having one or more N-substituted maleimide groups and a derivative thereof;
  (B) a modified conjugated diene polymer, and
  (C) a thermoplastic elastomer other than the above component (B),
  wherein:
  the component (B) is one resulting from modification of (b1) a conjugated diene polymer having a vinyl group in the side chain with (b2) a maleimide compound having two or more N-substituted maleimide groups.
2. The maleimide resin composition according to claim 1, wherein the component (B) has, in the side chain, a substituent (x) resulting from reaction between the vinyl group which the component (b1) has and the N-substituted maleimide group which the component (b2) has.
3. The maleimide resin composition according to claim 2, wherein the substituent (x) is a group containing, as a structure derived from the component (b2), a structure represented by the following general formula (B-11) or (B-12):

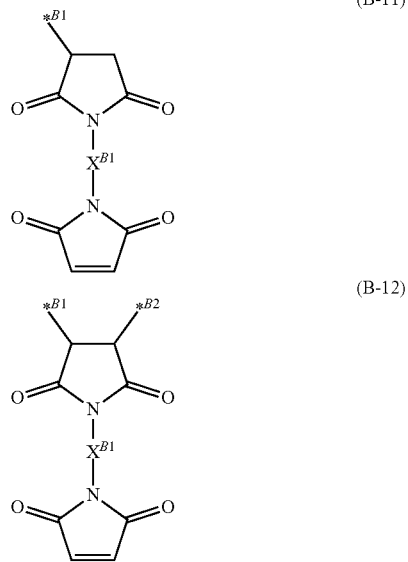

wherein XB1 is a divalent organic group; is a site binding with the carbon atom derived from the vinyl group which the component (b1) has in the side chain; and *B2 is a site binding with other atom.

4. The maleimide resin composition according to claim 1, wherein the number average molecular weight of the component (B) is 700 to 6,000.

5. The maleimide resin composition according to claim 1, wherein the component (b1) is a polybutadiene having a 1,2-vinyl group.

6. The maleimide resin composition according to claim 5, wherein the content of a structural unit having a 1,2-vinyl group is 50 mol % or more relative to the total structural units derived from butadiene constituting the polybutadiene having a 1,2-vinyl group.

7. The maleimide resin composition according to claim 1, wherein the component (b2) is at least one selected from the group consisting of an aromatic maleimide compound having one N-substituted maleimide group in the molecule, an aromatic bismaleimide compound having two N-substituted maleimide groups in the molecule and an aromatic polymaleimide compound having three or more N-substituted maleimide groups in the molecule.

8. The maleimide resin composition according to claim 1, wherein a content ratio of the component (A) to the component (B) [(A)/(B)] is more than 1.0 on a mass basis.

9. The maleimide resin composition according to claim 1, wherein, relative to 100 parts by mass of the total of the components (A) to (C), the content of the component (A) is 10 to 90 parts by mass, the content of the component (B) is 1 to 50 parts by mass, and the content of the component (C) is 5 to 60 parts by mass.

10. A prepreg containing the maleimide resin composition of claim 1 or a semi-cured product of the maleimide resin composition.

11. A resin film containing the maleimide resin composition of claim 1 or a semi-cured product of the maleimide resin composition.

12. A laminated board having a cured product of the maleimide resin composition of any one of claim 1, and a metal foil.

13. A printed wiring board having one or more selected from the group consisting of a cured product of the maleimide resin composition of claim 1.

14. A semiconductor package having the printed wiring board of claim 13 and a semiconductor device.

15. A method for producing the maleimide resin composition of claim 1, the method comprising the following steps 1 and 2:

Step 1: a step of reacting (b1) a conjugated diene polymer having a vinyl group in the side chain and (b2) a maleimide compound having two or more N-substituted maleimide groups to obtain (B) a modified conjugated diene polymer; and Step 2: a step of mixing (A) one or more selected from the group consisting of a maleimide compound having one or more N-substituted maleimide groups and a derivative thereof, (B) the modified conjugated diene polymer and (C) a thermoplastic elastomer other than the component (B).

* * * * *